(12) United States Patent
Takemura et al.

(10) Patent No.: US 9,797,931 B2
(45) Date of Patent: Oct. 24, 2017

(54) MATRIX DEVICE, MEASUREMENT METHOD OF CHARACTERISTICS THEREOF, AND DRIVING METHOD THEREOF

(71) Applicant: Semiconductor Energy Laboratory Co., Ltd., Atsugi-shi, Kanagawa-ken (JP)

(72) Inventors: Yasuhiko Takemura, Kanagawa (JP); Hiroyuki Miyake, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 35 days.

(21) Appl. No.: 14/844,458

(22) Filed: Sep. 3, 2015

(65) Prior Publication Data

US 2016/0071447 A1    Mar. 10, 2016

(30) Foreign Application Priority Data

Sep. 5, 2014    (JP) .................................. 2014-180767

(51) Int. Cl.
*G09G 3/3233*     (2016.01)
*G01R 19/10*      (2006.01)
(Continued)

(52) U.S. Cl.
CPC ......... *G01R 19/10* (2013.01); *G01R 19/0092* (2013.01); *G09G 3/2092* (2013.01);
(Continued)

(58) Field of Classification Search
CPC ........... G09G 3/3233; G09G 2320/029; G09G 2320/0295; G09G 2320/02851
See application file for complete search history.

(56) References Cited

U.S. PATENT DOCUMENTS 7,068,333 B2   6/2006  Ohashi
7,088,052 B2   8/2006  Kimura
(Continued)

FOREIGN PATENT DOCUMENTS

JP    4927216    5/2012

OTHER PUBLICATIONS

Mutsumi Hamaguchi1, Akira Nagao2, Masayuki Miyamoto2, "A 240Hz-Reporting-Rate 143×81 Mutual-Capacitance Touch-Sensing Analog Front-End IC with 37dB SNR for 1mm-Diameter Stylus", 2014 IEEE International Solid-State Circuits Conference, ISSCC 2014 / Feb. 11, 2014, pp. 214-216.

*Primary Examiner* — Amare Mengistu
*Assistant Examiner* — Shawna Stepp Jones
(74) *Attorney, Agent, or Firm* — Fish & Richardson P.C.

(57) ABSTRACT

To provide a measurement method of characteristics of an electrical element which causes variation in the luminance of pixels. In a device which includes components (pixels) arranged in a matrix and a wiring and where each component is capable of supplying current to the wiring through an electrical element included in each component, supply and non-supply of current of N components are individually set and current flowing through the wiring is measured N times. In the respective N measurements, combinations of the supply and non-supply of current in N components capable of supplying current to the wiring differ from one another. The amount of current flowing through each electrical element is obtained based on current obtained by the N measurements and the combinations of supply and non-supply of current in the N measurements.

8 Claims, 21 Drawing Sheets

(51) Int. Cl.
*G01R 19/00* (2006.01)
*G09G 3/20* (2006.01)

(52) U.S. Cl.
CPC ........... *G09G 2300/0426* (2013.01); *G09G 2300/0814* (2013.01); *G09G 2300/0819* (2013.01); *G09G 2300/0842* (2013.01); *G09G 2320/045* (2013.01); *G09G 2330/12* (2013.01); *G09G 2360/14* (2013.01); *G09G 2360/142* (2013.01)

(56) References Cited

U.S. PATENT DOCUMENTS

| | | |
|---|---|---|
| 8,982,091 B1 | 3/2015 | Mohindra |
| 2008/0312854 A1* | 12/2008 | Chemin .............. G01R 15/202 702/64 |
| 2013/0271426 A1 | 10/2013 | Yumoto et al. |
| 2015/0130865 A1* | 5/2015 | Shim .................. G09G 3/3233 345/694 |

* cited by examiner

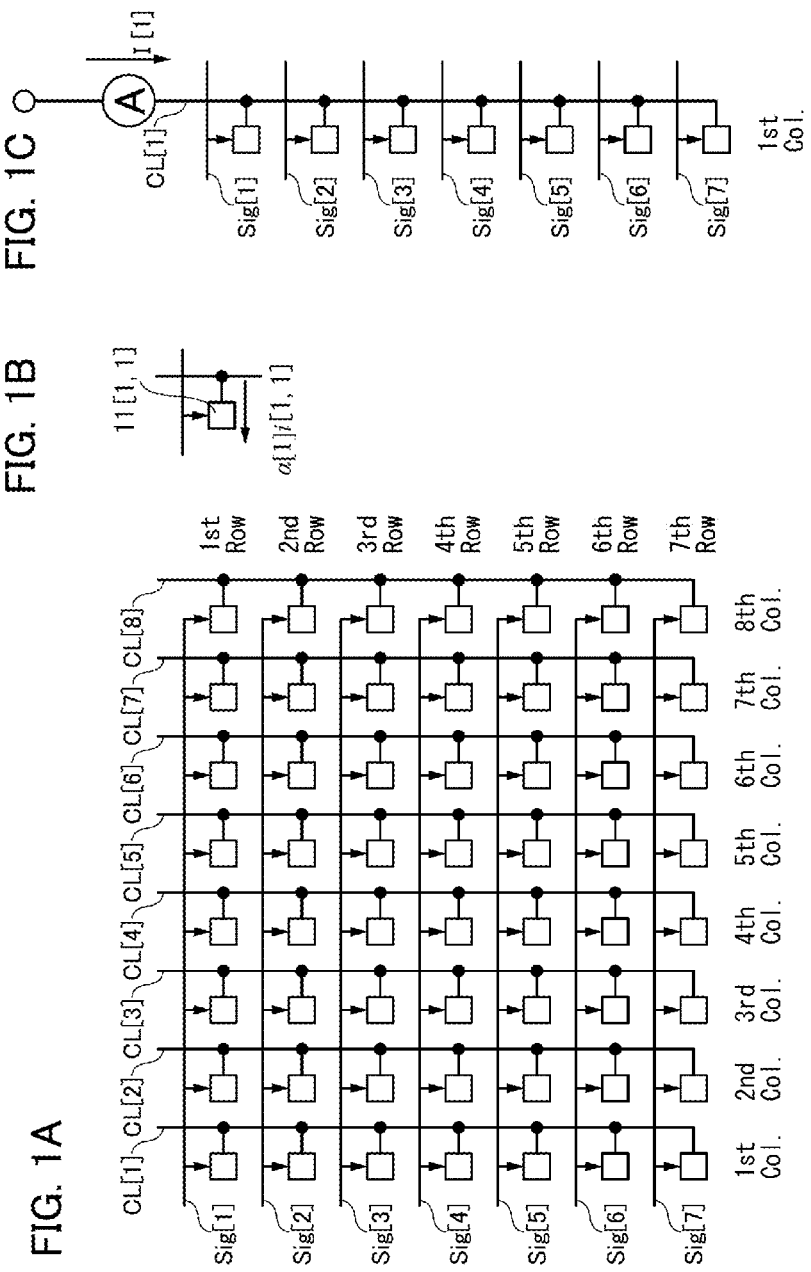

100C

100C

100C

100D

100D

100D

100E

100E

100E

100F

100F

100F

100G

100G

100G

302 Display portion
301 Housing
303 Supporting base

311 Housing
312 Display portion

313 Operation key

342 Display portion
341 Housing

326 Speaker
328 Stylus
324 Display portion

322 Housing
327 Operation key
323 Display portion
321 Housing
325 Microphone

331 Housing
332 Display portion 353
354
352
357
355
351
356

MATRIX DEVICE, MEASUREMENT METHOD OF CHARACTERISTICS THEREOF, AND DRIVING METHOD THEREOF

BACKGROUND OF THE INVENTION

1. Field of the Invention

This disclosure relates to a matrix device which performs processing such as display and detection using current flowing through electrical elements included therein.

2. Description of the Related Art

In an active matrix display device including a light-emitting element, each pixel is provided with a transistor (a driving transistor) for controlling the value of current supplied to the light-emitting element in accordance with an image signal, and variation in threshold voltage value influences the luminance of the light-emitting element. In order to prevent the variation in threshold voltage value from influencing the luminance of the light-emitting element, Patent Document 1 discloses a display device in which characteristics of a driving transistor in each pixel are measured in advance and an image signal corrected in accordance with the measured characteristics is supplied to each pixel.

Specifically, when the potentials of driving transistors in pixels in a certain row are set to a specific value by which the transistors are operated in a saturation region, current flowing through the respective driving transistors is measured. Such operation is sequentially performed on the driving transistors in the pixels in all rows.

Note that not only display devices but all devices which include components arranged in a matrix (such as pixels) and perform processing such as display, measurement, detection, or arithmetic operation with current flowing through one or more electrical elements (e.g. transistors) existing in each component have a problem similar to the above.

REFERENCE

Patent Document

[Patent Document 1] U.S. Pat. No. 7,088,052

SUMMARY OF THE INVENTION

Provided is a novel method for measuring the current characteristics of an electrical element in a matrix device, a novel device to which such a measurement method can be applied, a method for setting a device to which such a measurement method is applied, a manufacturing method thereof, and the like.

As an example, in a device which includes components arranged in a matrix and a wiring and where each component is capable of supplying current to the wiring through an electrical element included in each component, operation of the components is set so that two or more components of N components capable of supplying current to the wiring supply current to the wiring and the other components of the N components do not supply current to the wiring, and the current flowing through the wiring is measured N times. In the respective N measurements, combinations of supply and non-supply of current of the N components differ from one another. The amount of current flowing through each electrical element is calculated based on current obtained by the N measurements and the combinations of supply and non-supply of the current in the N measurements.

Alternatively, provided is a method in which, in a device which includes components arranged in a matrix with N rows (N is an integer greater than or equal to 2) and a wiring and where each component is capable of supplying current to the wiring using a corresponding one of electrical elements included in the components, operation of the components is set so that two or more components of N components capable of supplying current to the wiring do supply current to the wiring and the other components in the N components do not supply current to the wiring, the current flowing through the wiring is measured N times, and the amount of current supplied to the wiring by the components is obtained by calculating the amount of current flowing through electrical elements based on current I[1] to current I[N] obtained by the N measurements and combinations of supply and non-supply of currents by each of the components in the N measurements. In the respective N measurements, the combinations of supply and non-supply of currents in the N components differ from one another, and the amounts of currents flowing through the electrical elements are calculated using polynomials of the current I[1] to the current I[N].

Alternatively, provided is a method in which, in measuring currents flowing through wirings in a device which includes components arranged in a matrix with N rows and M columns (N and M are each an integer greater than or equal to 2) and M wirings, one for each column, and where each component is capable of supplying current to a corresponding one of the wirings using a corresponding one of electrical elements included in the components, supply and non-supply of current in the component in a kth row and an mth column (k is an integer greater than or equal to 1 and less than or equal to N and m is an integer greater than or equal to 1 and less than or equal to M) in an nth (n is an integer greater than or equal to 1 and less than or equal to N) measurement is set to $\alpha[k]_n$ ($\alpha[k]_n$ is 1 or 0, where $\alpha[k]_n$ is 1 in the case where current flows from the component to the wiring or in the case where current flows from the wiring to the component, and where $\alpha[k]_n$ is 0 in the case where current does not flow), current flowing through a wiring corresponding to an mth column is obtained by the nth measurement and identified as I[n,m], and the value of current that the component in the kth row and the mth column is capable of supplying to the corresponding wiring is determined based on the value of an element in the kth row and the mth column in an N×M matrix which is obtained by a product of an inverse matrix of a square matrix A with N rows (note that in the square matrix A with N rows, an element in an nth row and a kth column is $\alpha[k]_n$) and an N×M matrix I in which an element in an nth row and an mth column is I[n,m]. Here, none of elements of the inverse matrix of the square matrix A with N rows are zero in some cases. Alternatively, the amplitudes of all the elements of the inverse matrix of the square matrix A with N rows are the same in some cases. Alternatively, the square matrix A with N rows may be a circulant matrix. In this case, the square matrix A with N rows may be a circulant matrix in which N is an odd number and elements in an arbitrary row are either 1 or 0 and the sum of the elements in the arbitrary row is 2.

Alternatively, a matrix device set such that any of the above measurement methods can be performed is provided. The matrix device is a display device or a photodetector device. Alternatively, a driving method of a matrix device where input data or output data is corrected based on the current value of a component which is measured by any of the measurement methods is provided.

The reliability of measurement of the current value can be improved in any of the examples, and other effects can be derived from the description of the specification, the drawings, the claims, and the like.

BRIEF DESCRIPTION OF THE DRAWINGS

In the accompanying drawings:

FIGS. 1A to 1C are diagrams showing a structural example of a matrix device;

DETAILED DESCRIPTION OF THE INVENTION

Figures 2A, 2B, 2C:
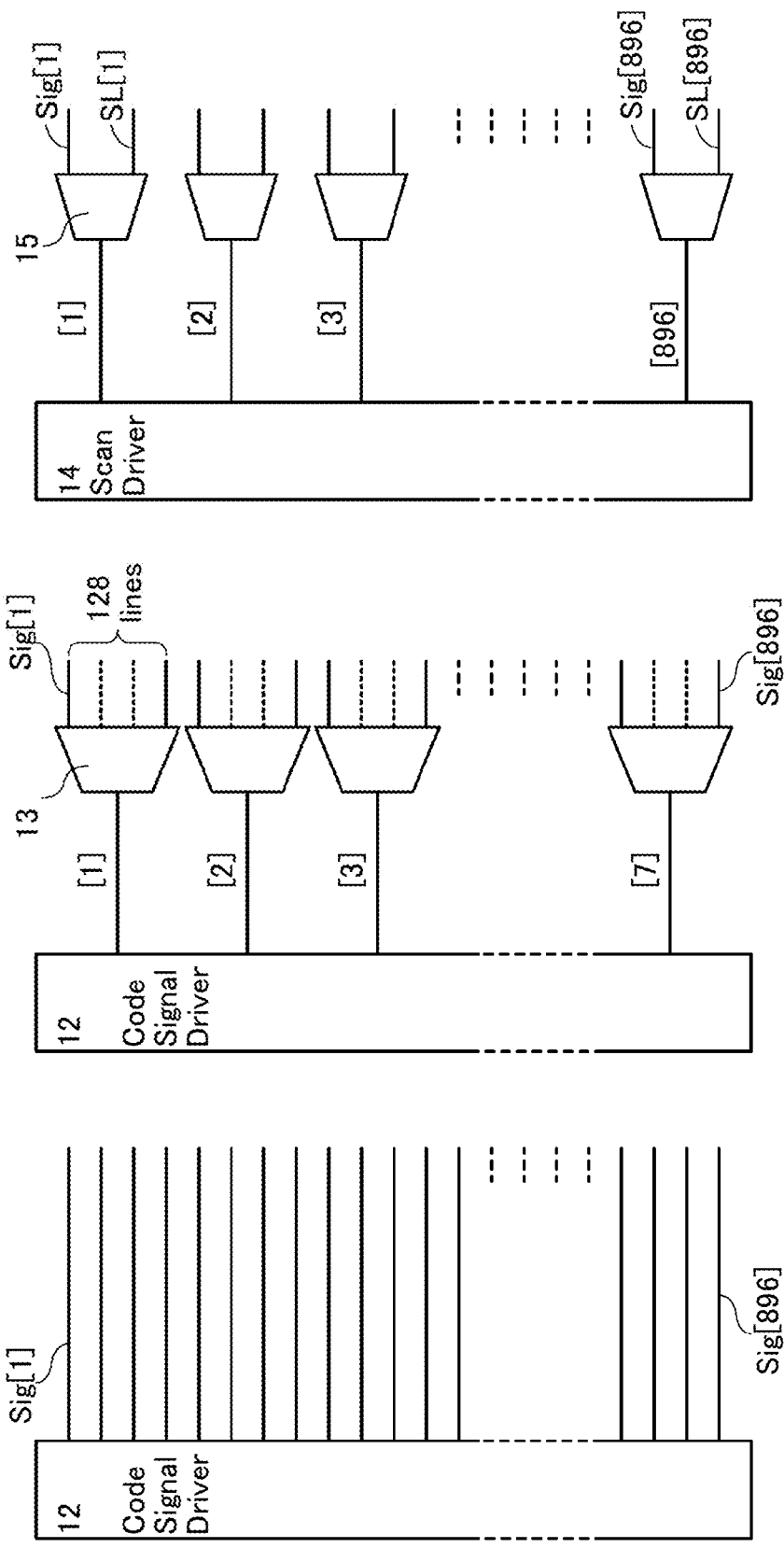
FIGS. 2A to 2C are diagrams each showing a structural example of a matrix device.

Hereinafter, embodiments will be described in detail with reference to the accompanying drawings. Note that the embodiments are not limited to the following description, and it will be easily understood by those skilled in the art that various changes and modifications can be made without departing from the spirit and scope and that, for example, techniques of this disclosure can be combined and a technique of this disclosure and a technique not mentioned in this disclosure can be combined. One embodiment therefore should not be construed as being limited to the following description of the embodiments. In addition, in the following embodiments, the same portions or portions having similar functions are denoted by the same reference numerals in different drawings, and description thereof will not be repeated.

In the drawings, the size, the layer thickness, or the region is exaggerated for clarity in some cases. Therefore, embodiments are not limited to such a scale. Note that the drawings are schematic views showing ideal examples, and embodiments are not limited to shapes or values shown in the drawings. For example, the following can be included: variation in signal, voltage, or current due to noise or difference in timing.

In this specification and the like, a transistor is an electrical element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source. Here, since the source and the drain of the transistor change depending on the structure, the operating condition, and the like of the transistor, it is difficult to define which is a source or a drain. Thus, a portion that functions as a source or a portion that functions as a drain is not referred to as a source or a drain in some cases. In that case, one of the source and the drain might be referred to as a first electrode, and the other of the source and the drain might be referred to as a second electrode.

In addition, in this specification, "node" refers to any point on a wiring provided to connect electrical elements electrically.

Note that in this specification, ordinal numbers such as "first", "second", and "third" are used in order to avoid confusion among components, and thus do not limit the number of the components.

Note that the layout of circuit blocks in a drawing specifies the positional relationship for description. Thus, even when a drawing shows that different functions are achieved in different circuit blocks, an actual circuit or region may be configured so that the different functions are achieved in the same circuit block. The function of each circuit block in a drawing is specified for description. Thus, even when one circuit block is illustrated, an actual circuit or region may be configured so that processing which is illustrated as being performed in the one circuit block is performed in a plurality of circuit blocks.

Embodiment 1

FIG. 1A shows a matrix device with seven rows and eight columns. Here, a plurality of pixels 11 are arranged in a matrix. For example, the pixel in a seventh row and an eighth column is denoted as a pixel 11[7,8]. Furthermore, a plurality of code signal lines Sig and a plurality of column signal lines CL are provided so as to intersect with each other. For example, a code signal line Sig in a first row is denoted as a code signal line Sig[1], and a column signal line CL in a first column is denoted as a column signal line CL[1].

Each of the pixels 11 is brought into a state of either supplying or not supplying current to the corresponding column signal line CL in accordance with a signal of the corresponding code signal line Sig. For example, as illustrated in FIG. 1B, the pixel 11[1,1] passes current $\alpha[1]i[1,1]$ in the direction denoted by an arrow. Here, when current flows, $\alpha[1]$ is 1, and when current does not flow, $\alpha[1]$ is 0. The value "i[1,1]" is the specific current value of the pixel 11[1,1] and is not necessarily the same as the current values i of the other pixels. Note that a change over time in the current value i is considered negligible.

Here, as for the first column, as shown in FIG. 1C, the current I[1] flowing through the column signal line CL[1] is the sum of the current flowing through the pixel 11[1,1] to the pixel 11[7,1]. Note that signals of at least two code signal lines Sig are set so that corresponding pixels 11 supply current to the column signal line CL[1]. Note that here, currents are not supplied to the column signal lines CL from pixels other than pixels shown in the figure.

As for the current $I[1]_{t=1}$ at time t=1, the following formula is satisfied.

$$I[1]_{t=1} = \alpha[1]_{t=1} i[1, 1] + \alpha[2]_{t=1} i[2, 1] + \ldots + \alpha[7]_{t=1} i[7, 1] = \sum_{n=1}^{7} \alpha[n]_{t=1} i[n, 1] \quad \text{[Formula 1]}$$

Similarly, as for the current $I[1]_{t=2}$ at t=2, the following formula is satisfied.

$$I[1]_{t=2} = \alpha[1]_{t=2} i[1, 1] + \alpha[2]_{t=2} i[2, 1] + \ldots + \alpha[7]_{t=2} i[7, 1] = \sum_{n=1}^{7} \alpha[n]_{t=2} i[n, 1] \quad \text{[Formula 2]}$$

In this manner, similar equations are obtained for the current $I[1]_{t=3}$ at t=3 to the current $I[1]_{t=7}$ at t=7.

Here, when the current $I[1]_{t=1}$ to the current $I[1]_{t=7}$ are measurable physical quantities and the current value i[1,1] to the current value i[7,1] are unknowns, these equations are simultaneous equations with seven unknowns. Accordingly, the current value i[1,1] to the current value i[7,1] can be obtained by solving the equations.

The equations are represented by the following formula.

$$\begin{pmatrix} I[1]_{t=1} \\ I[1]_{t=2} \\ I[1]_{t=3} \\ I[1]_{t=4} \\ I[1]_{t=5} \\ I[1]_{t=6} \\ I[1]_{t=7} \end{pmatrix} = A \begin{pmatrix} i[1, 1] \\ i[2, 1] \\ i[3, 1] \\ i[4, 1] \\ i[5, 1] \\ i[6, 1] \\ i[7, 1] \end{pmatrix} \quad \text{[Formula 3]}$$

Here, A is expressed by the following formula.

$$A = \begin{pmatrix} \alpha[1]_{t=1} & \alpha[2]_{t=1} & \alpha[3]_{t=1} & \alpha[4]_{t=1} & \alpha[5]_{t=1} & \alpha[6]_{t=1} & \alpha[7]_{t=1} \\ \alpha[1]_{t=2} & \alpha[2]_{t=2} & \alpha[3]_{t=2} & \alpha[4]_{t=2} & \alpha[5]_{t=2} & \alpha[6]_{t=2} & \alpha[7]_{t=2} \\ \alpha[1]_{t=3} & \alpha[2]_{t=3} & \alpha[3]_{t=3} & \alpha[4]_{t=3} & \alpha[5]_{t=3} & \alpha[6]_{t=3} & \alpha[7]_{t=3} \\ \alpha[1]_{t=4} & \alpha[2]_{t=4} & \alpha[3]_{t=4} & \alpha[4]_{t=4} & \alpha[5]_{t=4} & \alpha[6]_{t=4} & \alpha[7]_{t=4} \\ \alpha[1]_{t=5} & \alpha[2]_{t=5} & \alpha[3]_{t=5} & \alpha[4]_{t=5} & \alpha[5]_{t=5} & \alpha[6]_{t=5} & \alpha[7]_{t=5} \\ \alpha[1]_{t=6} & \alpha[2]_{t=6} & \alpha[3]_{t=6} & \alpha[4]_{t=6} & \alpha[5]_{t=6} & \alpha[6]_{t=6} & \alpha[7]_{t=6} \\ \alpha[1]_{t=7} & \alpha[2]_{t=7} & \alpha[3]_{t=7} & \alpha[4]_{t=7} & \alpha[5]_{t=7} & \alpha[6]_{t=7} & \alpha[7]_{t=7} \end{pmatrix} \quad \text{[Formula 4]}$$

When an inverse matrix of A is $A^{-1}$, the following formula is satisfied.

$$\begin{pmatrix} i[1, 1] \\ i[2, 1] \\ i[3, 1] \\ i[4, 1] \\ i[5, 1] \\ i[6, 1] \\ i[7, 1] \end{pmatrix} = A^{-1} \begin{pmatrix} I[1]_{t=1} \\ I[1]_{t=2} \\ I[1]_{t=3} \\ I[1]_{t=4} \\ I[1]_{t=5} \\ I[1]_{t=6} \\ I[1]_{t=7} \end{pmatrix} \quad \text{[Formula 5]}$$

Although focus is placed on only the first column in the above description, current flowing through the other column signal lines can be measured at the same time. Accordingly, supposing that the matrix I and the matrix ι are expressed by the following Formulae 6 and 7, respectively, Formula 8 is satisfied.

$$I = \quad \text{[Formula 6]}$$

$$\begin{pmatrix} I[1]_{t=1} & I[2]_{t=1} & I[3]_{t=1} & I[4]_{t=1} & I[5]_{t=1} & I[6]_{t=1} & I[7]_{t=1} & I[8]_{t=1} \\ I[1]_{t=2} & I[2]_{t=2} & I[3]_{t=2} & I[4]_{t=2} & I[5]_{t=2} & I[6]_{t=2} & I[7]_{t=2} & I[8]_{t=2} \\ I[1]_{t=3} & I[2]_{t=3} & I[3]_{t=3} & I[4]_{t=3} & I[5]_{t=3} & I[6]_{t=3} & I[7]_{t=3} & I[8]_{t=3} \\ I[1]_{t=4} & I[2]_{t=4} & I[3]_{t=4} & I[4]_{t=4} & I[5]_{t=4} & I[6]_{t=4} & I[7]_{t=4} & I[8]_{t=4} \\ I[1]_{t=5} & I[2]_{t=5} & I[3]_{t=5} & I[4]_{t=5} & I[5]_{t=5} & I[6]_{t=5} & I[7]_{t=5} & I[8]_{t=5} \\ I[1]_{t=6} & I[2]_{t=6} & I[3]_{t=6} & I[4]_{t=6} & I[5]_{t=6} & I[6]_{t=6} & I[7]_{t=6} & I[8]_{t=6} \\ I[1]_{t=7} & I[2]_{t=7} & I[3]_{t=7} & I[4]_{t=7} & I[5]_{t=7} & I[6]_{t=7} & I[7]_{t=7} & I[8]_{t=7} \end{pmatrix}$$

$$\iota = \quad \text{[Formula 7]}$$

$$\begin{pmatrix} i[1, 1] & i[1, 2] & i[1, 3] & i[1, 4] & i[1, 5] & i[1, 6] & i[1, 7] & i[1, 8] \\ i[2, 1] & i[2, 2] & i[2, 3] & i[2, 4] & i[2, 5] & i[2, 6] & i[2, 7] & i[2, 8] \\ i[3, 1] & i[3, 2] & i[3, 3] & i[3, 4] & i[3, 5] & i[3, 6] & i[3, 7] & i[3, 8] \\ i[4, 1] & i[4, 2] & i[4, 3] & i[4, 4] & i[4, 5] & i[4, 6] & i[4, 7] & i[4, 8] \\ i[5, 1] & i[5, 2] & i[5, 3] & i[5, 4] & i[5, 5] & i[5, 6] & i[5, 7] & i[5, 8] \\ i[6, 1] & i[6, 2] & i[6, 3] & i[6, 4] & i[6, 5] & i[6, 6] & i[6, 7] & i[6, 8] \\ i[7, 1] & i[7, 2] & i[7, 3] & i[7, 4] & i[7, 5] & i[7, 6] & i[7, 7] & i[7, 8] \end{pmatrix}$$

$$I = A\iota \quad \text{[Formula 8]}$$

Thus, the following Formula 9 is obtained.

$$\iota = A^{-1} I \quad \text{[Formula 9]}$$

That is, the current value i[n,m] can be expressed as a polynomial of the current $I[m]_{t=n}$. Here, n is an integer less than or equal to 7, and m is an integer less than or equal to 8.

Although the above description relates to a matrix device with seven rows and eight columns, it can also be applied to a matrix device with an arbitrary scale. That is, in a matrix device with N rows and M columns, a matrix A is a square matrix with N rows and a matrix I and a matrix ι are each a matrix with N rows and M columns.

Here, A is a matrix whose elements are either 1 or 0. Note that in the above-described example, A is a square matrix with seven rows while the matrix device has seven rows. However, in some cases, only a square matrix with an odd number of rows can be used as A though a matrix device has eight rows, for example.

In this case, for example, the matrix device is divided into the first row to the fifth row and the fourth row to the eighth row, on each of which measurement similar to the above is performed. In this case, the fourth row and the fifth row are subjected to the measurement twice, and thus two results are obtained. Any of the two results may be employed, or the average value may be used as the result. Furthermore, it is necessary that current be not supplied to the column signal lines CL from the pixels 11 in the sixth row to the seventh row in a period during which measurement of characteristics of the first row to the fifth row is performed.

Alternatively, for example, the measurement may be performed as follows: as a first measurement, the first row to the fifth row are measured; as a second measurement, the second row to the sixth row are measured; as a third measurement, the third row to the seventh row are measured; as a fourth measurement, the fourth row to the eighth row are measured; as a fifth measurement, the first row and the fifth row to the eighth row are measured; as a sixth measurement, the first row, the second row, the sixth row to the eighth row are measured; as a seventh measurement, the first row to the third row, the seventh row, and the eighth row are measured; and as an eighth measurement, the first row to the fourth row and the eighth row are measured. In this case, the measurement is performed on each row five times. The average value of the respective results may be used.

Further alternatively, a virtual row with the pixels 11 whose current values i are 0 may be added and calculation may be performed. Since it is a virtual row (a virtual pixel), the code signal line Sig does not exist and thus does not transmit a signal practically. As the current value is 0, whatever a signal of the code signal line Sig is, current is not supplied to the column signal line CL. For example, when the matrix device has six rows and the matrix A is a square matrix with seven rows, one virtual row is added, measurement is performed, and calculation is performed with obtained current I and the $A^{-1}$.

Here, the number of elements 0 in $A^{-1}$ is preferably closer to half of the number of all components in $A^{-1}$. In contrast, examples of a matrix in which most of elements are 0 include an identity matrix (all elements other than diagonal elements are 0). For example, when A is an identity matrix, $A^{-1}$ is also an identity matrix. Accordingly, the following formula is satisfied.

$$i[1,1]=I[1]_{r=1} \quad \text{[Formula 10]}$$

Note that in the case where A is an identity matrix, a conventional method in which current is measured row by row is employed. Here, although the current $I[1]_{r=1}$ can be measured, the measurement result includes a measurement error, a noise, and the like. In the conventional method, the adverse effects of a noise is considerable, and it cannot be determined whether or not the measurement result is an abnormal value due to an incidental noise by only one measurement, and accordingly the measurement is required to be performed plural times. For example, in a matrix device with seven rows, the measurement is performed once on each row, and thus the measurement is required to be performed seven times, and furthermore, such measurement is repeated plural times.

In the case where the current value i[1,1] is represented by a polynomial containing the current $I[1]_{r=1}$ to the current $I[1]_{r=7}$, even when an abnormal value is included in any of the current $I[1]_{r=1}$ to the current $I[1]_{r=7}$, it is canceled by the other values, and thus the obtained current value i[1,1] is less likely to be an abnormal value. This is because the current $I[1]_{r=1}$ to the current $I[1]_{r=7}$ are measured at different times (with temporal dispersion) and thus it is less likely for two or more of the current $I[1]_{r=1}$ to the current $I[1]_{r=7}$ to each include an abnormal value than for only one of the currents.

A specific example is described below. First, a circulant matrix where only one of elements in each row in the matrix A is 0 and the others are 1 is considered. This matrix is hereinafter called a first matrix. That is, supposing that the matrix A is expressed by Formula 11, an inverse matrix thereof is represented by Formula 12.

$$A = \begin{pmatrix} 0 & 1 & 1 & 1 & 1 & 1 & 1 \\ 1 & 0 & 1 & 1 & 1 & 1 & 1 \\ 1 & 1 & 0 & 1 & 1 & 1 & 1 \\ 1 & 1 & 1 & 0 & 1 & 1 & 1 \\ 1 & 1 & 1 & 1 & 0 & 1 & 1 \\ 1 & 1 & 1 & 1 & 1 & 0 & 1 \\ 1 & 1 & 1 & 1 & 1 & 1 & 0 \end{pmatrix} \quad \text{[Formula 11]}$$

$$A^{-1} = \frac{1}{6}\begin{pmatrix} -5 & 1 & 1 & 1 & 1 & 1 & 1 \\ 1 & -5 & 1 & 1 & 1 & 1 & 1 \\ 1 & 1 & -5 & 1 & 1 & 1 & 1 \\ 1 & 1 & 1 & -5 & 1 & 1 & 1 \\ 1 & 1 & 1 & 1 & -5 & 1 & 1 \\ 1 & 1 & 1 & 1 & 1 & -5 & 1 \\ 1 & 1 & 1 & 1 & 1 & 1 & -5 \end{pmatrix} \quad \text{[Formula 12]}$$

Next, a circulant matrix in which only two successive elements are 0 and the other elements are 1 in each row in the matrix A is considered. This circulant matrix is hereinafter called a second matrix. That is, supposing that the matrix A is expressed by Formula 13, an inverse matrix thereof is represented by Formula 14.

$$A = \begin{pmatrix} 0 & 0 & 1 & 1 & 1 & 1 & 1 \\ 1 & 0 & 0 & 1 & 1 & 1 & 1 \\ 1 & 1 & 0 & 0 & 1 & 1 & 1 \\ 1 & 1 & 1 & 0 & 0 & 1 & 1 \\ 1 & 1 & 1 & 1 & 0 & 0 & 1 \\ 1 & 1 & 1 & 1 & 1 & 0 & 0 \\ 0 & 1 & 1 & 1 & 1 & 1 & 0 \end{pmatrix} \quad \text{[Formula 13]}$$

$$A^{-1} = \frac{1}{5}\begin{pmatrix} -2 & 3 & -2 & 3 & -2 & 3 & -2 \\ -2 & -2 & 3 & -2 & 3 & -2 & 3 \\ 3 & -2 & -2 & 3 & -2 & 3 & -2 \\ -2 & 3 & -2 & -2 & 3 & -2 & 3 \\ 3 & -2 & 3 & -2 & -2 & 3 & -2 \\ -2 & 3 & -2 & 3 & -2 & -2 & 3 \\ 3 & -2 & 3 & -2 & 3 & -2 & -2 \end{pmatrix} \quad \text{[Formula 14]}$$

Here, in each of the first matrix and the second matrix, the sums of elements in rows are equal (six in the first matrix, and five in the second matrix). Therefore, it is probable that the amounts of the current $I[1]_{r=1}$ to the current $I[1]_{r=7}$ are approximately the same when the current value i[1,1] to the current value i[7,1] are approximately the same (e.g., a ratio between the maximum value and the minimum value is less than or equal to 1.1). Specifically, it is probable that the amount of each of the current $I[1]_{r=1}$ to the current $I[1]_{r=7}$ is approximately six times as large as the average of the current value i[1,1] to the current value i[7,1] in the first matrix, and that the amount of each of the current $I[1]_{r=1}$ to the current $I[1]_{r=7}$ is approximately five times as large as the average of the current value i[1,1] to the current value i[7,1] in the second matrix.

For example, when attention is focused on the current value i[1,1], Formula 15 and Formula 16 hold in the first matrix and the second matrix, respectively.

$$i[1,1] = \frac{1}{6}(-5I[1]_{t=1} + I[1]_{t=2} + I[1]_{t=3} + I[1]_{t=4} + I[1]_{t=5} + I[1]_{t=6} + I[1]_{t=7})$$ [Formula 15]

$$i[1,1] = \frac{1}{5}(-2I[1]_{t=1} + 3I[1]_{t=2} - 2I[1]_{t=3} + 3I[1]_{t=4} - 2I[1]_{t=5} + 3I[1]_{t=6} - 2I[t]_{t=7})$$ [Formula 16]

Here, the amplitudes of terms in these polynomials are considered. In the first matrix, the ratio of the largest to the smallest of the amplitudes is approximately 5 to 1. In the second matrix, the amplitude of a term with the largest amplitude is approximately one and a half times as large as the amplitude of a term with the smallest amplitude. In this case, it can be concluded that the reliability of the current value i[1,1] using the second matrix is higher due to a smaller contribution degree of the term with the largest amplitude than when using the first matrix. Note that it is easily understood that the same conclusion can be drawn even when the rows in the first matrix (or the second matrix) are replaced with each other (replacing the rows means only changing the order of the simultaneous equations with multiple unknowns; therefore, their solutions do not change).

It is a feature of a circulant matrix that the sums of elements in rows are equal. Thus, when a circulant matrix is used in which the amplitudes of elements in an inverse matrix thereof are all equal, the reliability can be increased the most. Examples of such a matrix include a circulant matrix which is a square matrix with an odd number of rows and in which two elements are 1 and all of the others are 0 in each row, as described below. This circulant matrix is hereinafter called a third matrix. For example, in the case of a square matrix with seven rows, the following is given.

$$A = \begin{pmatrix} 1 & 1 & 0 & 0 & 0 & 0 & 0 \\ 0 & 1 & 1 & 0 & 0 & 0 & 0 \\ 0 & 0 & 1 & 1 & 0 & 0 & 0 \\ 0 & 0 & 0 & 1 & 1 & 0 & 0 \\ 0 & 0 & 0 & 0 & 1 & 1 & 0 \\ 0 & 0 & 0 & 0 & 0 & 1 & 1 \\ 1 & 0 & 0 & 0 & 0 & 0 & 1 \end{pmatrix}$$ [Formula 17]

An inverse matrix of this matrix is expressed by Formula 18.

$$A^{-1} = \frac{1}{2}\begin{pmatrix} 1 & -1 & 1 & -1 & 1 & -1 & 1 \\ 1 & 1 & -1 & 1 & -1 & 1 & -1 \\ -1 & 1 & 1 & -1 & 1 & -1 & 1 \\ 1 & -1 & 1 & 1 & -1 & 1 & -1 \\ -1 & 1 & -1 & 1 & 1 & -1 & 1 \\ 1 & -1 & 1 & -1 & 1 & 1 & -1 \\ -1 & 1 & -1 & 1 & -1 & 1 & 1 \end{pmatrix}$$ [Formula 18]

In Formula 18, the amplitudes of the elements are all equal.

Note that when current values i[n,m] are compared to each other, for example, a coefficient ½ of the inverse matrix is not important and, in practice, may be changed for convenience in calculation. For example, a coefficient ½ of the inverse matrix may be regarded as 1. As a result, a polynomial obtained from the inverse matrix (a formula from which the current value i[n,m] is derived) becomes the addition and subtraction of current I[m]$_{t=n}$, leading to a significant reduction in calculation amount. Note that when the comparison is made between different matrices, ignoring the coefficient is not preferable.

Generally, in an inverse matrix of a circulant matrix which is a square matrix with N rows (N is an odd number) with elements of either 1 or 0 and in which the sum of elements in each row is two and an element in the first row and the first column and an element in the first row and the second column are 1, an element in an mth row and a kth column is ½ when m=k, and $½(-1)^{m+k-1}$ when m≠k. More generally, in a circulant matrix which is a square matrix with N rows (N is an odd number) with elements of either 1 or 0 and in which the sum of elements in each row is two, elements of an inverse matrix thereof are either ½ or –½ and the sum of elements in each row is ½ in some cases. It is obvious that a matrix obtained by only replacing rows of such a matrix offers a similar feature.

The elements in the inverse matrix are not 0 as described above. Therefore, in a polynomial obtained from such an inverse matrix, the number of terms is N and a coefficient of each term is ½ or –½. This is canceled by a measured current I which is approximately twice the average of the current values i (the current I is the sum of current flowing through two pixels 11).

Note that "using the third matrix as the matrix A" means a method of sequentially performing the following procedure: in a matrix device, two rows are selected, current is made to flow through each pixel 11 of the selected two rows, and the total amount of the current is measured. In the method, for example, a first row and a second row are selected first, and then, the second row and a third row are selected.

This method is similar to a conventional method (a method of sequentially performing a procedure in which, in a matrix device, one row is selected, current is made to flow through pixels 11 in the selected row, and the current is measured), but achieves a novel effect as described above in terms of reducing the influence of noise.

It is considered that, when the matrix A is a circulant matrix, the amounts of the current I[1]$_{t=1}$ to the current I[1]$_{t=7}$ are approximately the same as described above. This means that current flowing through the column signal line CL can be measured with approximately the same errors.

In measuring a physical quantity (e.g., current), an error (a resolution) depends on the absolute value of a physical quantity to be measured. For example, when a measurement error of current of 1 mA is 1 μA, a measurement error of current of 10 mA is rarely 1 μA. In general, a measurement error is proportional to the physical property of a measurement target, and thus, a measurement error of current of 10 mA is approximately 10 μA. That is, it is difficult to perform measurement in a wide range with the same precision.

In the case where the current value i[1,1] is expressed by a polynomial containing the current I[1]$_{t=1}$ to the current I[1]$_{t=7}$ as described above, when a measurement error of the current I[1]$_{t=1}$ to the current I[1]$_{t=6}$ is 1 μA and a measurement error of the current I[1]$_{t=7}$ is 10 μA, an error of the polynomial is approximately 10 μA.

Therefore, it is preferable that values to be measured be approximately the same in order to maintain measurement precision. Since current flowing through the column signal line CL can be approximately the same, measurement conditions are preferably set such that the matrix A is a circulant matrix.

Besides, there is an issue of a lower measurement limit. In the case where current flowing through one transistor is approximately 1 mA, a measurement error is 1 μA in the above-described example. However, when a lower measurement limit is 100 μA, the precision of measurement is lower than this and determined by the lower measurement limit. That is, current flowing through one transistor is measured with an error of approximately 10%. On the other hand, when current flowing through 1000 transistors is measured at the same time, a measurement value is approximately 1 A. This value is sufficiently larger than the lower measurement limit. Therefore, the lower measurement limit does not become an error factor, and an error in the measured value is approximately 1 mA (approximately 0.1% of the measured value).

Thus, the current value i[1,1] to the current value i[7,8] can be expressed as polynomials. In general, these values can be obtained by substituting numerical values (the current $I[1]_{t=1}$ to the current $I[8]_{t=7}$ and elements of $A^{-1}$) into these polynomials. However, when the number of rows in a matrix device is increased, the amount of calculation is enormously increased (if the number of rows is increased twofold, the number of terms is increased fourfold, and accordingly, the amount of required calculation is increased fourfold or more).

The matrix device may have a configuration in which a signal is directly input from a code signal driver 12 to a code signal line Sig as shown in FIG. 2A. Alternatively, the matrix device may have a configuration in which a signal of the code signal driver 12 is input to one of the code signal lines Sig selected by a demultiplexer 13 as shown in FIG. 2B. In FIG. 2B, one of 128 code signal lines Sig is selected.

As described above, the increase in the number of rows in the matrix device enormously increases the amount of required arithmetic operation. In view of this, the matrix device is preferably divided into a plurality of portions to perform the measurement. For example, since the matrix device shown in FIG. 2A has 896 rows, seven rows such as 1st to 7th rows, 8th to 14th rows, or 15th to 21st rows are measured at a time. For example, when pixels 11 in the 1st to 7th rows are measured, pixels 11 in the 8th to 896th rows are prevented from supplying current to the column signal line CL.

In the device shown in FIG. 2B, it is required that the column signal line CL[1] is prevented from being supplied with current from the pixels 11 by any signals of code signal lines Sig not selected by the demultiplexer 13.

In the code signal driver 12 shown in FIG. 2B, a plurality of terminals may each have a function of outputting a signal depending on the matrix A. For example, when the matrix A has seven rows, seven kinds of signals are output to seven terminals [1] to [7] in accordance with a reference signal such as a clock signal. For example, in the case where the matrix device has 896 rows, each of these seven signals is output by a corresponding 7-bit demultiplexer 13 to any of the corresponding 128 code signal lines Sig.

In the case where the matrix A is a circulant matrix, the code signal driver 12 may include a shift register capable of selecting two or more rows at the same time.

The code signal line Sig may be either a single wiring or a plurality of wirings. For example, one code signal line Sig may be composed of two wirings.

As described above, when the number of rows in the matrix device is increased, the number of terms in the polynomial for obtaining the current value i is obtained by the square of the number of rows. However, in the case where the matrix A is the third matrix, calculation amount can be reduced by performing the following special arithmetic operation.

For example, the case of obtaining current values i[1,m] to i[7,m] (m is an integer greater than or equal to 1 and less than or equal to 9) in a matrix device with seven rows and eight columns is considered. From an inverse matrix of the third matrix, Formula 19 is obtained.

$$i[j+1,m] = I[m]_{t=j} - i[j,m]$$ [Formula 19]

For example, the current value i[2,m] can be obtained if the current value i[1,m] is obtained, and the obtained current value i[2,m] can be used to obtain i[3,m]. Hence, the current values i[1,m] to i[7,m] can be obtained such that only the current value i[1,m] is obtained first by substituting numerical values (the current $I[1]_{t=1}$ to the current $I[8]_{t=7}$ and elements of $A^{-1}$) into the polynomial, and the other current values are obtained by sequentially using the obtained result. That is, calculation amount is approximately proportional to the number of rows.

In this case, a general driver such as a driver including a shift register can be used as the code signal driver 12. In a display pixel or the like to be described later, output from each row of a scan driver 14 may be output to any of a row selection line SL or the code signal line Sig selected by a demultiplexer 15 as shown in FIG. 2C. Note that in the case of measuring current, a clock frequency may be lowered so that a pulse width output from the scan driver 14 is increased more than the case of performing image display.

The matrix A may be a matrix other than a circulant matrix. For example, a matrix obtained by replacing −1 with 0 in elements in a Hadamard matrix may be used. For example, assuming that the matrix A is a square matrix with eight rows, the matrix A can be expressed by Formula 20.

$$A = \begin{pmatrix} 1 & 1 & 1 & 1 & 1 & 1 & 1 & 1 \\ 1 & 0 & 1 & 0 & 1 & 0 & 1 & 0 \\ 1 & 1 & 0 & 0 & 1 & 1 & 0 & 0 \\ 1 & 0 & 0 & 1 & 1 & 0 & 0 & 1 \\ 1 & 1 & 1 & 1 & 0 & 0 & 0 & 0 \\ 1 & 0 & 1 & 0 & 0 & 1 & 0 & 1 \\ 1 & 1 & 0 & 0 & 0 & 0 & 1 & 1 \\ 1 & 0 & 0 & 1 & 0 & 1 & 1 & 0 \end{pmatrix}$$ [Formula 20]

An inverse matrix thereof is expressed by Formula 21.

$$A^{-1} = \frac{1}{4}\begin{pmatrix} -3 & 1 & 1 & 1 & 1 & 1 & 1 & 1 \\ 1 & -1 & 1 & -1 & 1 & -1 & 1 & -1 \\ 1 & 1 & -1 & -1 & 1 & 1 & -1 & -1 \\ 1 & -1 & -1 & 1 & 1 & -1 & -1 & 1 \\ 1 & 1 & 1 & 1 & -1 & -1 & -1 & -1 \\ 1 & -1 & 1 & -1 & -1 & 1 & -1 & 1 \\ 1 & 1 & -1 & -1 & -1 & -1 & 1 & 1 \\ 1 & -1 & -1 & 1 & -1 & 1 & 1 & -1 \end{pmatrix}$$ [Formula 21]

Elements other than that in the first row and the first column are substantially 1 or −1. Thus, most of current values i are obtained by the addition and subtraction of current I to be measured. With regard to a pixel corresponding to the first row, arithmetic operation may be performed on the assumption that a code signal corresponding to the first column in the matrix A is supplied to a virtual pixel whose current value i is 0.

Figure 3A:
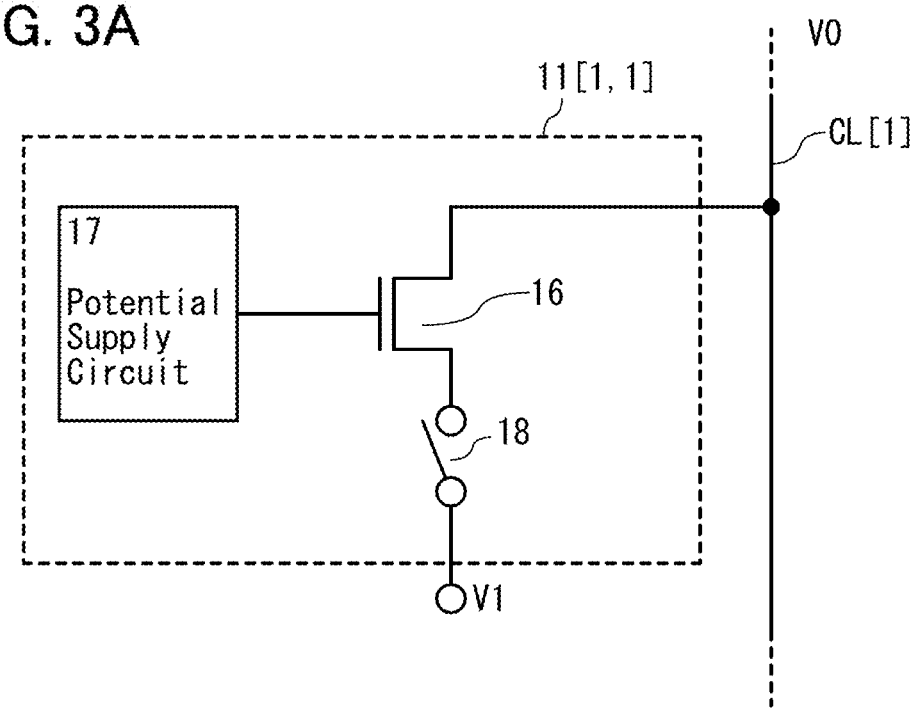
FIGS. 3A and 3B are diagrams each showing a pixel circuit example and an operation example thereof.

FIG. 3A shows an example of a circuit of the pixel 11[1,1]. The pixel 11[1,1] includes a transistor 16, a potential supply circuit 17, and a switch 18. The switch 18 may be composed of one transistor, a circuit including a plurality of transistors, or the like. Although an n-channel transistor is shown as the transistor 16, a p-channel transistor may be used. In the case of using a p-channel transistor, a source and a drain in the following description may be reversed.

Here, a gate of the transistor 16 is supplied with a potential from the potential supply circuit 17. The potential supply circuit 17 may have a function of bringing the gate into an electrically floating state (an electrically isolated state) after supplying the potential to the gate. The source of the transistor 16 can be connected to a node that supplies a potential V1 through the switch 18. A potential of the column signal line CL[1] is V0. Here, it is assumed that V0>V1.

For example, when the switch 18 is on, current depending on the current value i[1,1] can flow from the column signal line CL[1] to the pixel 11[1,1]. That is, $\alpha[1]$ is 1. At this time, the transistor 16 is set to operate in a saturation region. In other words, a potential of the gate of the transistor 16 is higher than V1+Vth (Vth is a threshold voltage value of the transistor 16) and lower than V0.

Note that the transistor 16 need not operate in a saturation region in the case where an object (e.g., a resistor or a diode) that generates a considerable potential difference is not present between the node that supplies the potential V1 and the source of the transistor 16.

When the switch 18 is off, current does not flow. That is, $\alpha[1]$ is 0.

In the above-described manner, the supply of current from the pixel 11[1,1] to the column signal line CL[1] can be controlled with a signal for controlling the switch 18 in the pixel 11[1,1]. Note that a current value between the drain and the source depends on a potential difference between the gate and the source. Thus, the potential difference between the gate and the source may be changed to perform similar measurement.

In the above-described example, "$\alpha[1]=1$" refers to the case where current flows from the column signal line CL[1] to the pixel 11[1,1]. Alternatively, "$\alpha[1]=1$" may refer to the case where current flows from the pixel 11[1,1] to the column signal line CL. In that case, the source and the drain in the above description may be reversed.

Figure 3B:
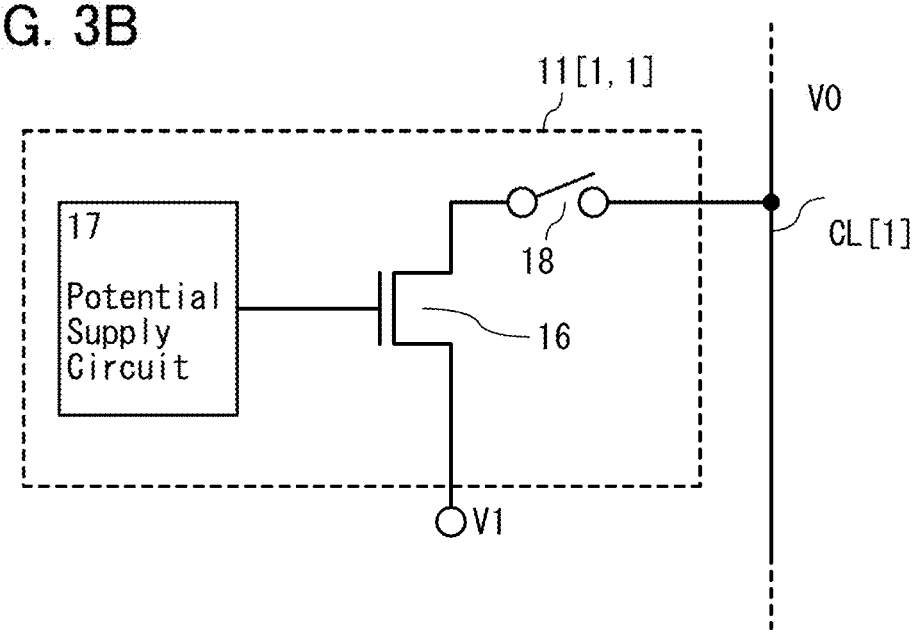

FIG. 3B shows another example of the circuit of the pixel 11[1,1]. In this example, the drain of the transistor 16 can be connected to the column signal line CL[1] through the switch 18.

In the above-described examples, the switch 18 is provided between the column signal line CL[1] and a wiring that supplies the potential V1. A structure without the switch 18 may be employed. For example, by controlling the transistor 16 by the potential supply circuit 17, the supply of current to the column signal line can be controlled.

Figure 4A:
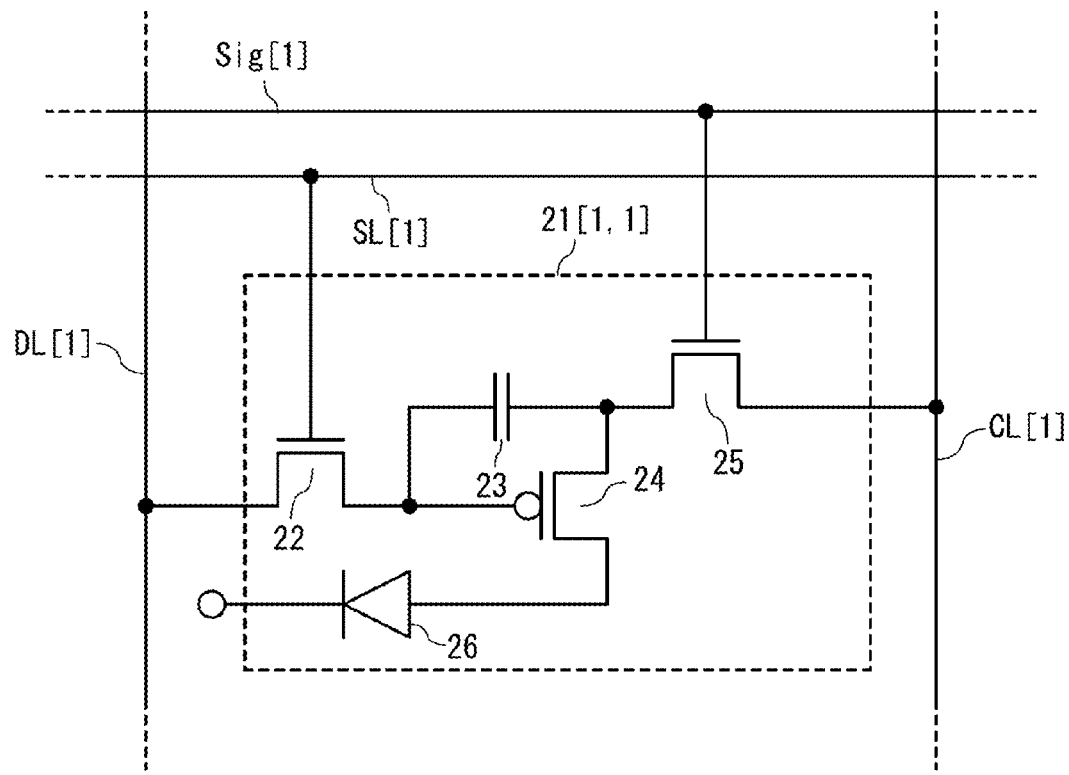
FIGS. 4A and 4B are diagrams each showing a circuit example of a display pixel.

Specific examples of the circuit are described below. FIG. 4A shows an example of a display pixel that is used in a display device where light-emitting elements (light-emitting diodes) provided in respective pixels are arranged in a matrix. A display pixel 21[1,1] in the first row and the first column in the display device includes a selection transistor 22, a capacitor 23, a driving transistor 24, a transistor 25, and a light-emitting element 26. Here, the driving transistor 24 and the transistor 25 correspond to the transistor 16 and the switch 18 in FIG. 3A, respectively.

Here, the transistor 25 is controlled by the code signal line Sig[1]. The selection transistor 22 is controlled by a row selection line SL[1]. The selection transistor 22 in an on state has a function of supplying a potential of the data line DL[1] to a gate of the driving transistor 24, and the selection transistor 22 in an off state has a function of holding the potential. Therefore, the selection transistor 22 corresponds to the potential supply circuit 17 in FIG. 3A.

In this example, the driving transistor 24 is a p-channel transistor. The selection transistor 22 and the transistor 25 may be an n-channel transistor or a p-channel transistor. In the description below, both of them are n-channel transistors.

In the case where display is performed using the display pixel 21[1,1], the transistor 25 is turned on. Furthermore, the potential of the column signal line CL[1] is set so that a potential difference between an anode and a cathode of the light-emitting element 26 is larger than a threshold voltage value of the light-emitting element 26. The column signal line CL[1] is used as a wiring for supplying current.

Figure 4B:
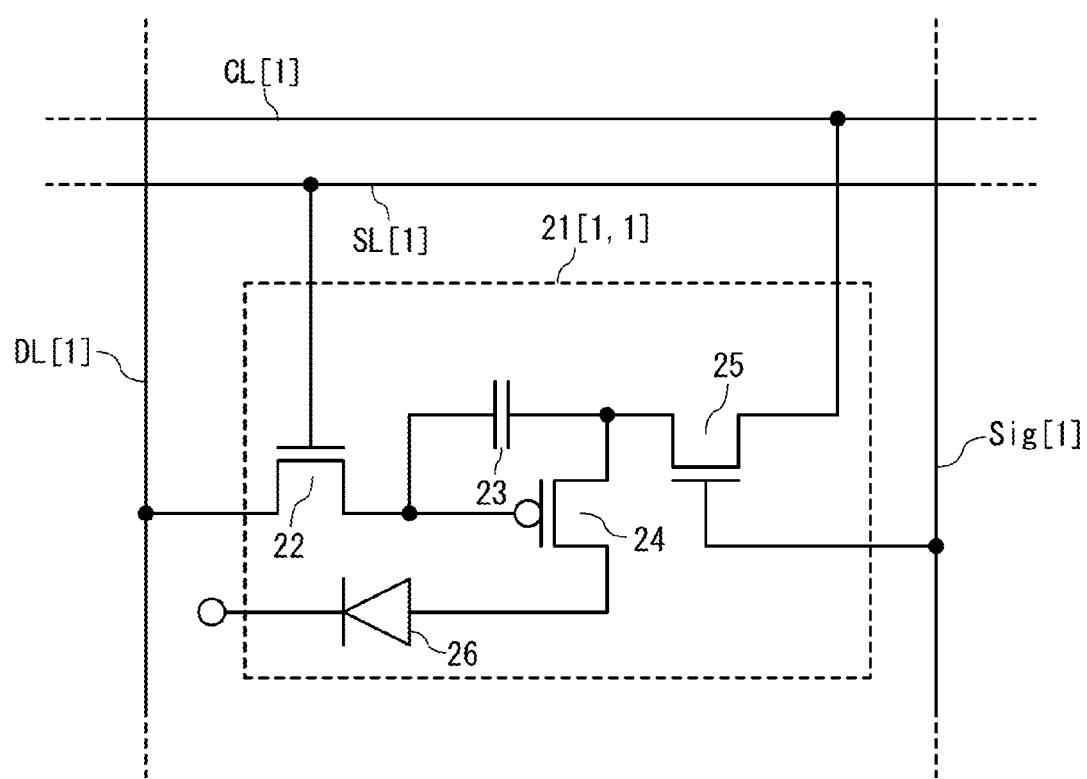

FIG. 4B shows another example of the display pixel. In the display pixel 21[1,1] shown in FIG. 4A, design is made so that the code signal line Sig[1] is parallel to the row selection line SL[1]. Alternatively, as shown in FIG. 4B, design may be made so that the code signal line Sig[1] crosses the row selection line SL[1]. In this case, design is made so that the column signal line CL[1] is parallel to the row selection line SL[1]. Such a modification is possible because the column signal line CL[1] is used as a wiring for supplying current and does not relate to row selection at the time of data input.

In the configuration shown in FIG. 4B, the code signal driver in FIGS. 2A and 2B and a driver (a data driver) for inputting a signal to the data line can be provided on the same side. As a result, for example, a width of a periphery of a pair of opposite sides (a width of a bezel) in the display device can be narrowed.

Figure 5A:
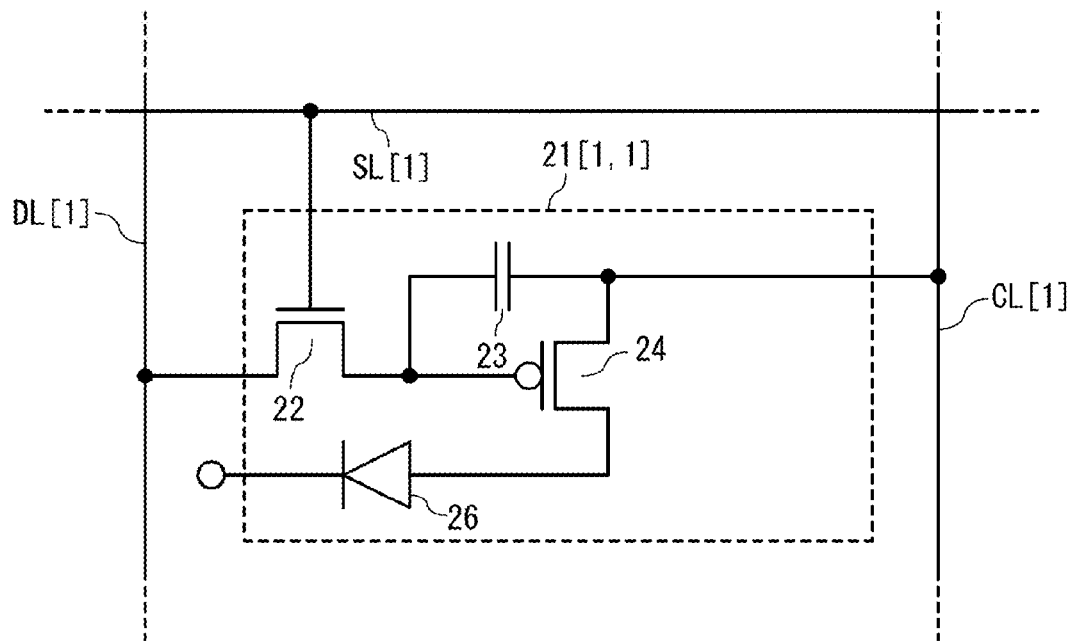
FIGS. 5A and 5B are diagrams each showing a circuit example of a display pixel.

In the above-described cases, the transistor 25 corresponding to the switch 18 is provided. However, as shown in FIG. 5A, the transistor 25 may be omitted. In that case, the driving transistor 24 is controlled by the selection transistor 22. To satisfy $\alpha=1$ (i.e., to pass a current through the driving transistor 24), the potential of the gate of the driving transistor 24 is made to have a proper value. To satisfy $\alpha=0$ (i.e., not to pass a current through the driving transistor 24), the potential of the gate of the driving transistor 24 is made to have another proper value.

This can be controlled by writing data to a pixel. For example, in the case where the matrix A is the third matrix, a first potential is written into only the first row and the second row, and a second potential is written into the other rows. Note that the first potential is a potential that turns on the driving transistor 24, and the second potential is a potential that turns off the driving transistor 24. In the case where the driving transistor 24 is a p-channel transistor, the first potential is lower than the second potential. After that, current of the column signal line CL is measured. In this method, data needs to be written N times (i.e., scanning N times) in a matrix device with N rows.

As another method, after the second potential is written into all the pixels and the selection transistors 22 are turned off, only the selection transistors 22 in the first row and the second row are turned on, a potential of the data line DL[1] at the time is set to the first potential, and current of the column signal line CL at the time is measured. The potential of the data line DL[1] is set to the second potential before one of the selection transistors 22 in the first row and the second row is turned off. In this method, the potential of the gate of the driving transistor 24 is the first potential only in a part of a period in which the selection transistor 22 is on.

An example of the driving method is described with reference to FIGS. 6A and 6B. FIG. 6A shows a state of data input when display is performed. A part of a pulse output to the first row selection line SL[1] overlaps with a part of a pulse output to a second row selection line SL[2]. That is, there is a period in which the potential of the first row selection line SL[1] and the potential of the second row selection line SL[2] are H (the selection transistor 22 in the first row selection line SL[1] and the selection transistor 22 in the second row selection line SL[2] are on). Similarly, a part of a pulse output to the second row selection line SL[2] overlaps with a part of a pulse output to a third row selection line SL[3]. The potential of the data line DL[1] when the potential of the first row selection line SL[1] is made to change from H to L is held as the potential of the gate of the driving transistor 24 in the first row selection line SL[1]. The same can be applied to other rows.

Figure 6B:
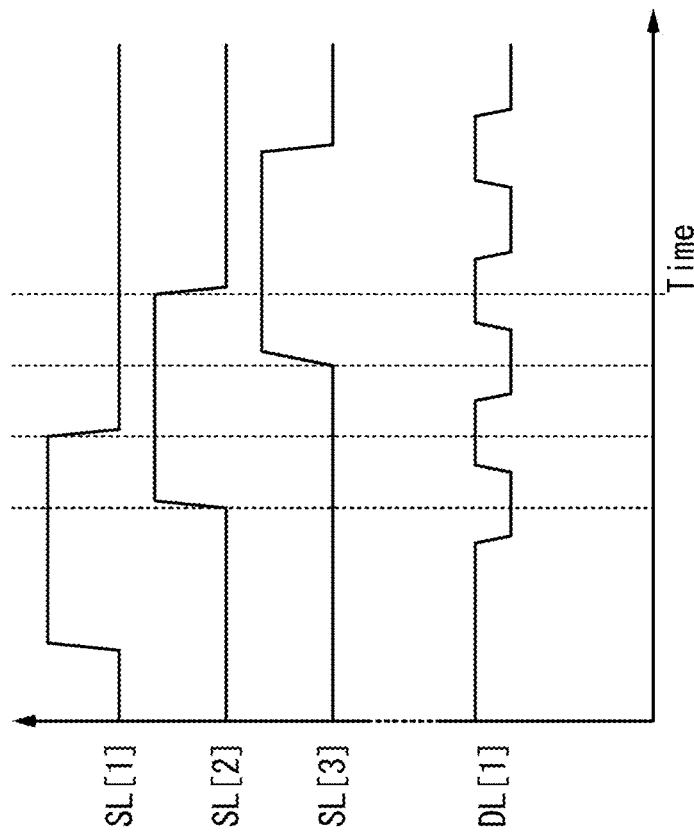
FIGS. 6A and 6B are diagrams each showing an operation example of a matrix device.
Figure 6A:
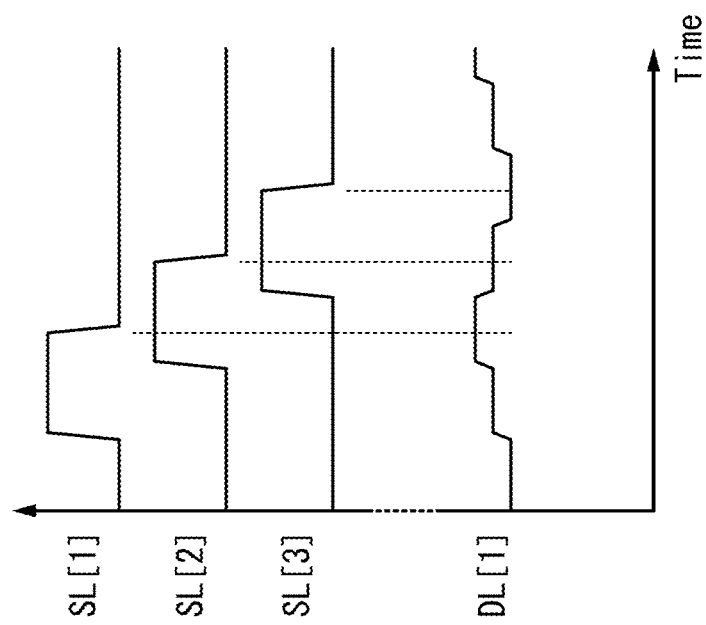

FIG. 6B shows a state when current of the column signal line CL[1] is measured. In this case, the cycle of a clock may be made long so that a pulse width is 10 to 1000 times that shown in FIG. 6A. Like the case of performing display, there is a period in which both the selection transistor 22 in the row selection line SL[1] and the selection transistor 22 in the row selection line SL[2] are on. In the period, the potential of the data line DL[1] is made to change from the second potential to the first potential. The potential of the data line DL[1] is made to change to the second potential before the selection transistor 22 in the row selection line SL[1] is turned off. The current of the column signal line CL[1] is measured in a period in which both the selection transistor 22 in the row selection line SL[1] and the selection transistor 22 in the row selection line SL[2] are on and the potential of the data line DL[1] is the first potential. Such operation is repeated.

Figure 5B:
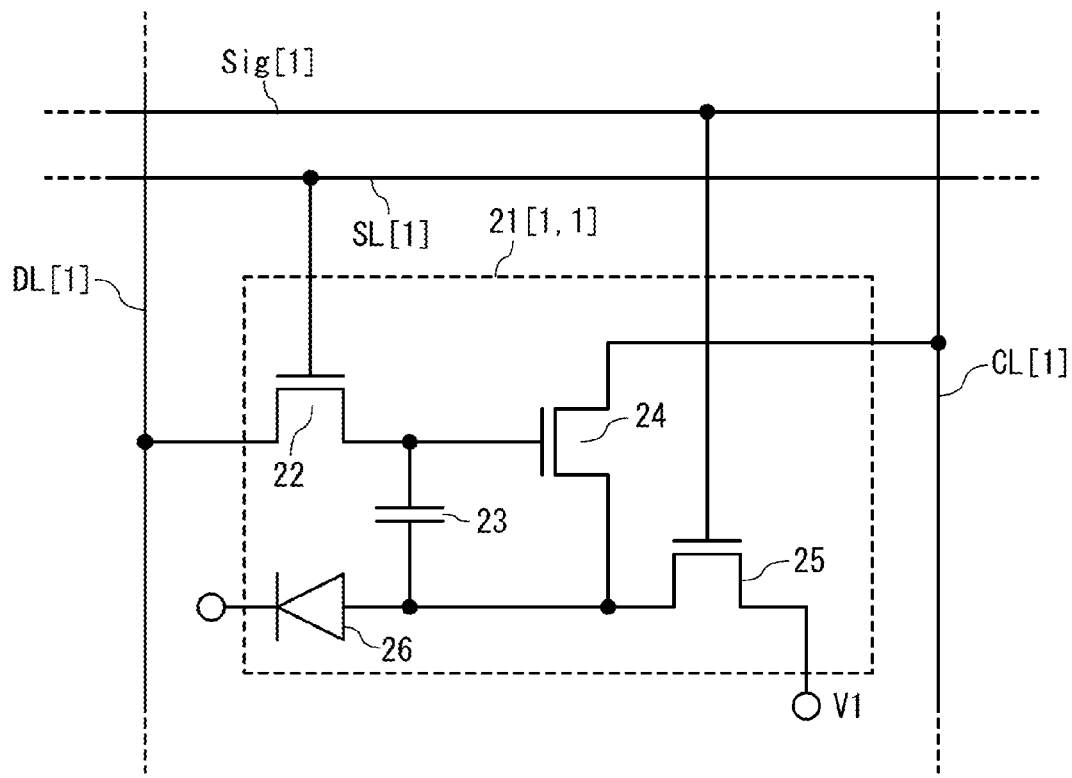

FIG. 5B shows another example of the display pixel. In the display pixel 21 shown in FIG. 5B, the driving transistor 24 is an n-channel transistor and has a source connectable to the node that supplies the potential V1 through the transistor 25. The transistor 25 is controlled by the code signal line Sig and is turned on at the time of measuring current in some cases.

In the display pixel 21[1,1] shown in FIG. 5B, it is necessary to prevent current from flowing through the light-emitting element 26 at the time of measuring current flowing through the driving transistor 24. This can be achieved by (1) providing another switch to prevent such current, (2) setting the potential of the column signal line CL[1] to an appropriate value, or (3) setting the potential of the cathode of the light-emitting element 26 to an appropriate value.

With regard to (1), for example, there is a method in which a switch such as a transistor is provided between a node that connects one electrode of the capacitor 23 to the source of the driving transistor 24 and the anode of the light-emitting element 26. As another method, a switch such as a transistor is provided on the cathode side of the light-emitting element 26. The switch is off in measuring current flowing through the driving transistor 24.

With regard to (2), for example, the potential of the column signal line CL[1] is set so that the potential difference between the anode and the cathode of the light-emitting element 26 is smaller than the threshold voltage value of the light-emitting element 26. With regard to (3), the potential of the cathode of the light-emitting element 26 is set so that the potential difference between the anode and the cathode of the light-emitting element 26 is smaller than the threshold voltage value of the light-emitting element 26 or a reverse bias is applied.

In the case where display is performed using the display pixel 21[1,1], the transistor 25 is turned off. Furthermore, the potential of the column signal line CL[1] is set so that the potential difference between the anode and the cathode of the light-emitting element 26 is larger than the threshold voltage value of the light-emitting element 26. The column signal line CL[1] is used as a wiring for supplying current.

As described above, the transistor 25 can be turned on only at the time of current measurement. Therefore, for example, output from the scan driver 14 through the demultiplexer 15 can be used as shown in FIG. 2C.

Figure 7A:
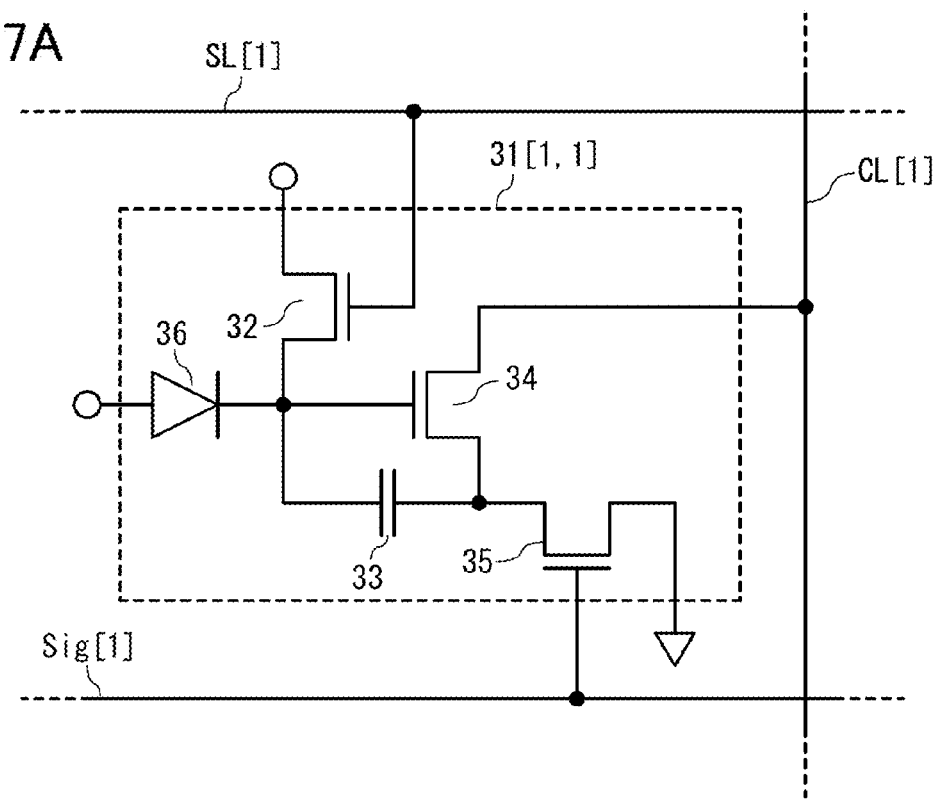
FIGS. 7A and 7B are diagrams each showing a circuit example of a photodetector pixel.

FIG. 7A shows an example of a photodetector pixel that is used in an image sensor including photodetector elements (e.g., photodiodes) arranged in a matrix. A photodetector pixel 31[1,1] in the first row and the first column of the image sensor includes a reset transistor 32, a capacitor 33, an amplifier transistor 34, a transistor 35, and a photodetector element 36. The photodetector pixel 31[1,1] shown in FIG. 7A may be provided with another electrical element. For example, a switch such as a transistor may be provided between a gate of the amplifier transistor 34 and a cathode of the photodetector element 36 so that the cathode of the photodetector element 36 and the gate of the amplifier transistor 34 can be connected to each other with the switch as necessary.

Figure 7B:
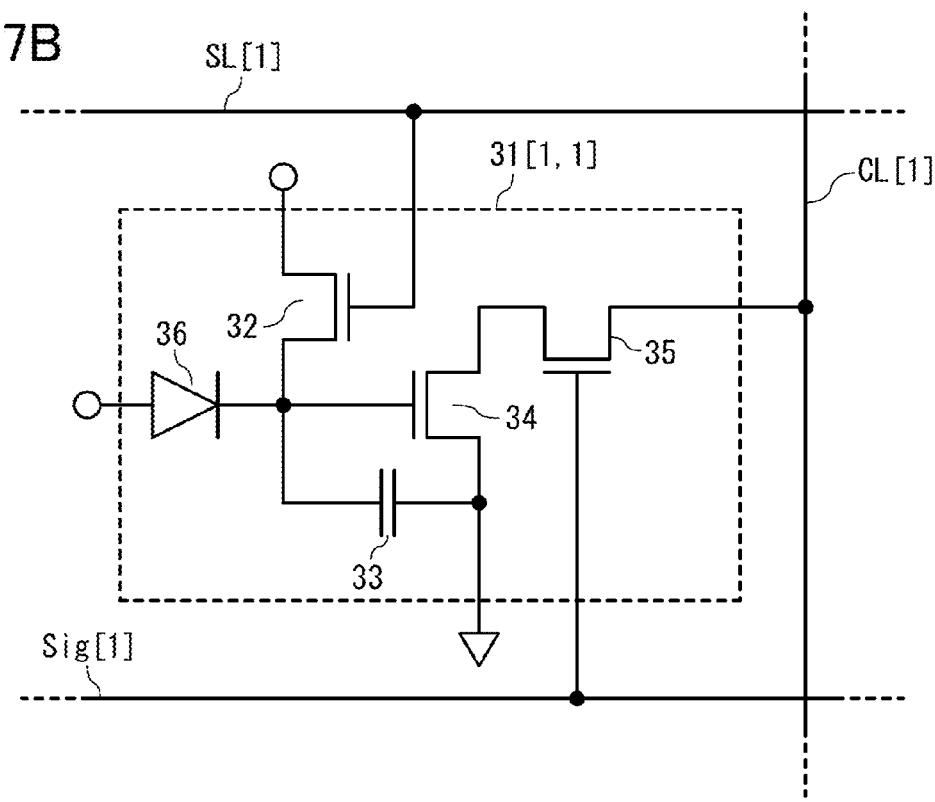

Here, the amplifier transistor 34 and the transistor 35 correspond to the transistor 16 and the switch 18 in FIG. 3A, respectively. The transistor 35 is controlled by the code signal line Sig[1]. The reset transistor 32 and the photodetector element 36 have a function of supplying and holding a potential necessary for the gate of the amplifier transistor 34. Therefore, the reset transistor 32 and the photodetector element 36 correspond to the potential supply circuit 17 in FIG. 3A. Note that as shown in FIG. 7B, the transistor 35 may be provided between the column signal line CL[1] and the amplifier transistor 34.

A method for controlling current flowing through the amplifier transistor 34 using the transistor 35 is as described above. Note that in the case of measuring a current value between a drain and a source of the amplifier transistor 34 to measure characteristics of the amplifier transistor 34, the measurement may be performed while the potential necessary for the gate of the amplifier transistor 34 is held using the reset transistor 32 in an environment where the photodetector element 36 is not irradiated with light.

Note that the photodetector pixel 31 is selected by turning on the transistor 35. Therefore, a configuration may be employed in which, in addition to a signal from the code signal driver, a signal from a driver (a row selection driver) for selecting a row can be input to the code signal line Sig. Alternatively, the row selection driver may perform a function of the code signal driver.

In the photodetector pixel 31, data for correcting variation in the characteristics of the amplifier transistor 34 can be obtained by measuring current flowing through photodetector pixels 31 in a plurality of rows from the column signal line CL[1]. Furthermore, output of the photodetector element 36 itself can be obtained. In this case, current flowing through the amplifier transistors 34 is obtained with high precision as described above. Consequently, image data (imaging data) with little noise can be obtained.

Embodiment 2

Specific Structure Example of Display Device

Figure 8:
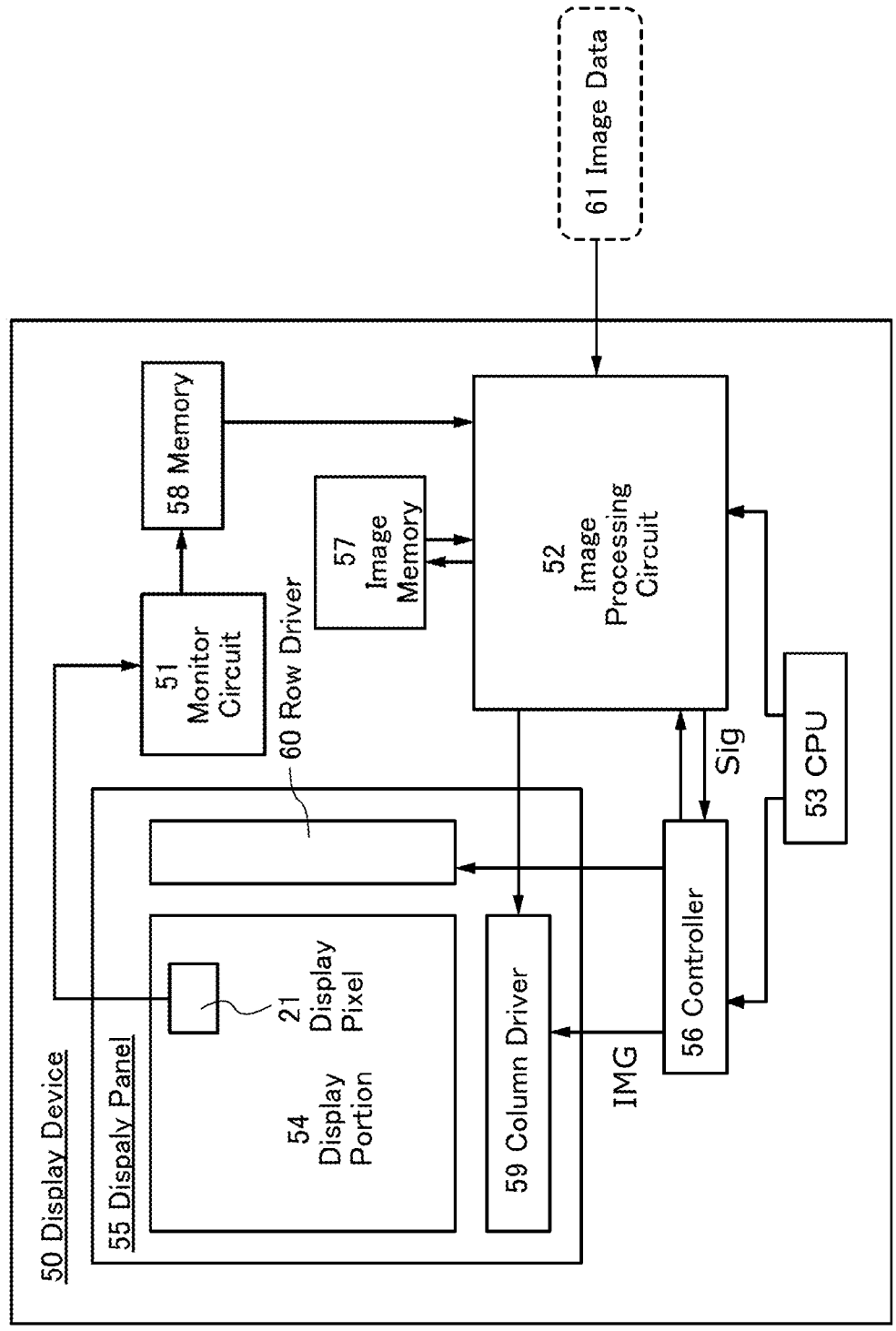
FIG. 8 is a diagram showing a structural example of a display device.

An example of a structure of a display device is described. FIG. 8 is a block diagram illustrating a structure of a display device 50. Although the block diagram shows circuit blocks classified according to their functions in independent circuit blocks, it may be practically difficult to completely separate the circuit blocks according to their functions and, in some cases, one circuit block may be involved in a plurality of functions.

The display device 50 illustrated in FIG. 8 includes a panel 55 including a plurality of display pixels 21 in a display portion 54, a controller 56, a CPU 53, an image processing circuit 52, an image memory 57, a memory 58, and a monitor circuit 51. Furthermore, the panel 55 includes a column driver 59 and a row driver 60.

The CPU 53 has a function of decoding an instruction input from the outside or an instruction stored in a memory provided in the CPU 53 and executing the instruction by controlling the overall operations of various circuits included in the display device 50.

The monitor circuit 51 determines the current values of driving transistors included in the respective display pixels by the method described in Embodiment 1. The memory 58 has a function of storing the current values.

The image memory 57 has a function of storing image data 61 which is input to the display device 50. Note that although just one image memory 57 is provided in the display device 50 in FIG. 8, a plurality of image memories 57 may be provided in the display device 50. For example, in the case where the display portion 54 displays a full-color image with the use of three pieces of image data 61 corresponding to hues such as red, blue, and green, the image memory 57 corresponding to each of the pieces of image data 61 may be provided.

As the image memory 57, for example, a memory circuit such as a dynamic random access memory (DRAM) or a static random access memory (SRAM) can be used. Alternatively, a video RAM (VRAM) may be used as the image memory 57.

The image processing circuit 52 has functions of writing and reading the image data 61 to and from the image memory 57 in response to an instruction from the CPU 53 and generating an image signal IMG from the image data 61. In addition, the image processing circuit 52 has a function of reading the data stored in the memory 58 in response to an instruction from the CPU 53 and correcting the image signal IMG using the data.

The controller 56 has a function of processing the image signal IMG which is input to the controller 56, in accordance with the specification of the panel 55 and then supplying the image signal IMG to the panel 55.

The row driver 60 has a function of selecting the display pixel 21 included in the display portion 54 row by row. The column driver 59 has a function of supplying the image signal IMG supplied from the controller 56 to the display pixel 21 in a row selected by the row driver 60. In addition, any of the column driver 59 and the row driver 60 outputs an output signal to the code signal line Sig. The other of the column driver 59 and the row driver 60 has a function of measuring a current value of the column signal line CL or a function of transferring a signal of the column signal line CL to another circuit for measurement of a current value.

Note that the controller 56 has a function of supplying a variety of driving signals used for driving the column driver 59, the row driver 60, and the like, to the panel 55. The driving signal includes a start pulse signal SSP, a clock signal SCK, and a latch signal LP for controlling operation of the column driver 59, a start pulse signal GSP and a clock signal GCK for controlling operation of the row driver 60, and the like.

Note that the display device 50 may include an input device having a function of supplying data or an instruction to the CPU 53 included in the display device 50. As the input device, a keyboard, a pointing device, a touch panel, a sensor, or the like can be used.

<Structural Example of Electrical Element>

Next, the specific structural example of electrical elements included in the display pixel 21 is described. Note that for a circuit diagram of the display pixel, refer to FIGS. 4A and 4B.

The potential of a pixel electrode of the light-emitting element 26 is controlled by the image signal IMG which is input to the display pixel 21. The luminance of the light-emitting element 26 is determined by a potential difference between the pixel electrode and a common electrode. For example, in the case where an OLED (an organic light-emitting diode) is used as the light-emitting element 26, one of the anode and the cathode serves as the pixel electrode and the other thereof serves as the common electrode. FIGS. 4A and 4B illustrate a configuration of the display pixel 21 in which the anode of the light-emitting element 26 is used as the pixel electrode and the cathode of the light-emitting element 26 is used as the common electrode.

The selection transistor 22 has a function of controlling conduction between the data line DL and the gate of the driving transistor 24. One of a pair of electrodes of the capacitor 23 is electrically connected to the gate of the driving transistor 24, and the other thereof is electrically connected to the anode of the light-emitting element 26. The switching of the selection transistor 22 is performed in accordance with the potential of the row selection line SL electrically connected to a gate of the selection transistor 22.

In these transistors and the other transistor included in the display pixel 21, an oxide semiconductor or an amorphous, microcrystalline, polycrystalline, or single crystal semiconductor can be used. As a material of such a semiconductor, silicon, germanium, and the like can be given. When the selection transistor 22 includes an oxide semiconductor in a channel formation region, the off-state current of the selection transistor 22 can be extremely low. Furthermore, when the selection transistor 22 having the above-described structure is used in the display pixel 21, leakage of electric charge accumulated in the gate of the driving transistor 24 can be prevented effectively as compared with the case where a transistor including a normal semiconductor such as silicon or germanium is used as the selection transistor 22. Therefore, an error at the time of performing measurement by any of the methods described in Embodiment 1 can be made small.

Accordingly, for example, in the case where image signals IMG each having the same image data are written to the display portion 54 for some consecutive frame periods as in the case of displaying a still image, display of an image can be maintained even when driving frequency is low, in other words, the number of operations of writing image signals IMG to the display portion 54 for a certain period is reduced. For example, a purified oxide semiconductor in which impurities serving as electron donors (donors), such as moisture or hydrogen, are reduced and oxygen vacancies are reduced is used for a semiconductor film of the selection transistor 22, whereby the interval between the operations of writing image signals IMG can be set to 10 seconds or longer, preferably 30 seconds or longer, or further preferably one minute or longer. As the interval between the operations of writing image signals IMG increases, power consumption can be further reduced.

In addition, since the potential of the image signal IMG can be held for a longer period, the quality of an image to be displayed can be prevented from being lowered even when the capacitor 23 for holding the potential of the gate of the driving transistor 24 is not provided in the display pixel 21.

The transistors each have the gate on at least one side of a semiconductor film; alternatively, the transistors may each have a pair of gates with a semiconductor film provided therebetween.

The transistors in FIGS. 4A and 4B are all n-channel transistors. When the transistors in the display pixel 21 have the same channel type, it is possible to omit some of steps for fabricating the transistors, for example, a step of adding an impurity element imparting one conductivity type to the semiconductor film. Note that in the display device, not all the transistors in the display pixel 21 are necessarily n-channel transistors.

<Structure Example 1 of Transistor>

As examples of the transistor included in the display device, top-gate transistors are illustrated in FIGS. 9A and 9B and 14A and 14B.

Figure 9A:
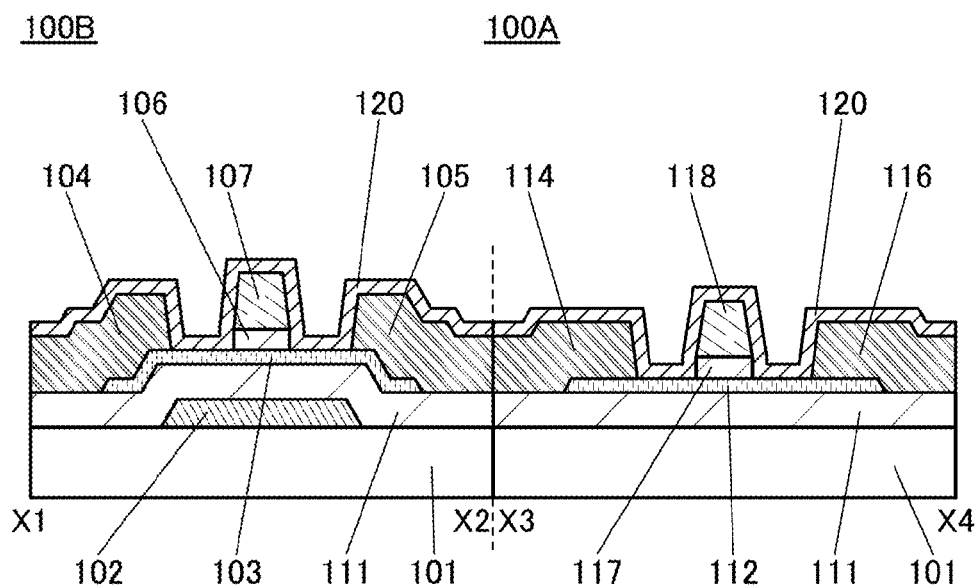
FIGS. 9A and 9B are cross-sectional views of transistors.
Figure 9B:
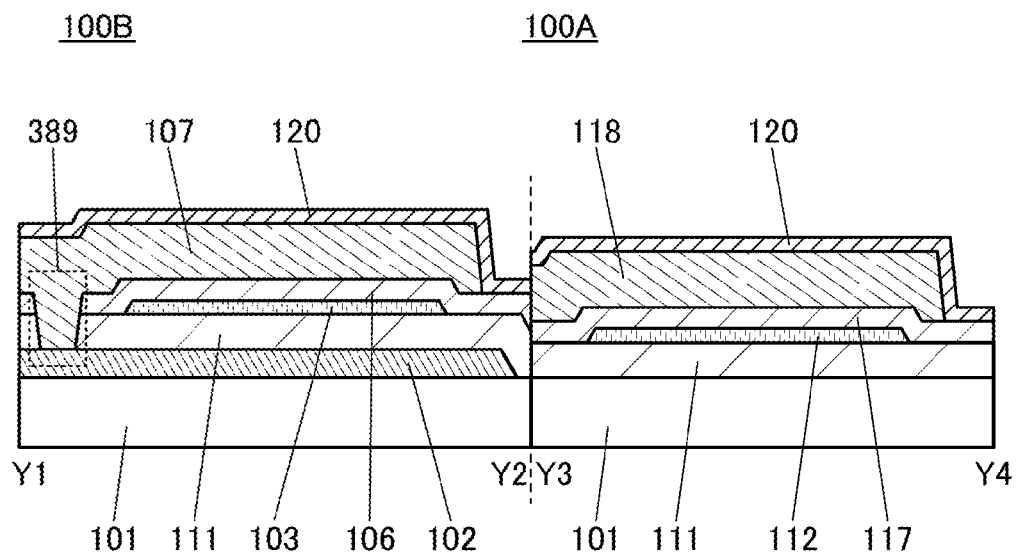
Figure 14A:
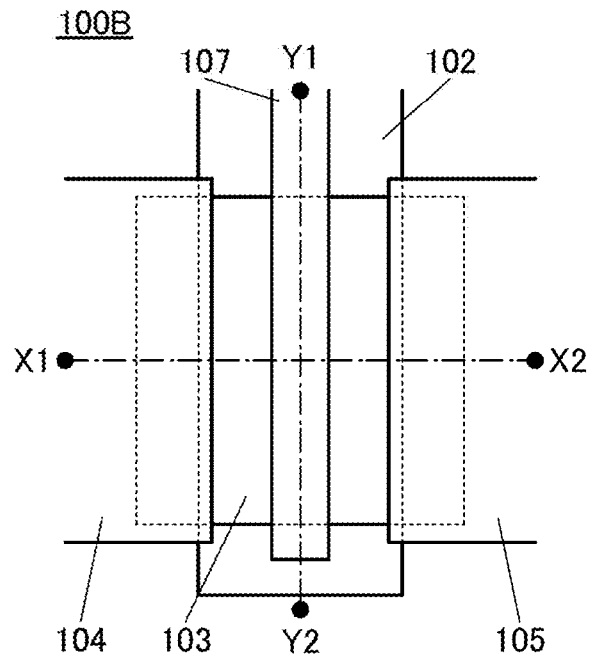
FIGS. 14A and 14B are top views of transistors.
Figure 14B:
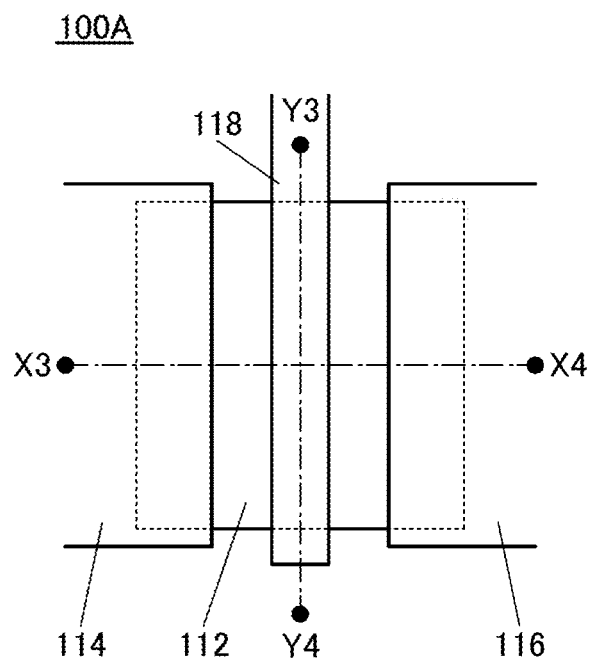

FIGS. 14A and 14B are top views of a transistor 100B provided in a driver circuit and a transistor 100A provided in the display portion 54, and FIGS. 9A and 9B are cross-sectional views of the transistor 100B and the transistor 100A. FIG. 14A is the top view of the transistor 100B, and FIG. 14B is the top view of the transistor 100A. FIG. 9A is the cross-sectional view taken along dashed-dotted line X1-X2 in FIG. 14A and dashed-dotted line X3-X4 in FIG. 14B. FIG. 9B is the cross-sectional view taken along dashed-dotted line Y1-Y2 in FIG. 14A and dashed-dotted line Y3-Y4 in FIG. 14B. Moreover, FIG. 9A is the cross-sectional view of the transistor 100A and the transistor 100B each in the channel length direction. FIG. 9B is the cross-sectional view of the transistor 100A and the transistor 100B each in the channel width direction.

In a manner similar to those of the transistor 100A and the transistor 100B, some components are not illustrated in some cases in top views of transistors described below. Furthermore, the directions of the dashed-dotted line X1-X2 and the dashed-dotted line X3-X4 may be called a channel length direction, and the direction of the dashed-dotted line Y1-Y2 and the dashed-dotted line Y3-Y4 may be called a channel width direction.

The transistor 100A illustrated in FIGS. 9A and 9B includes an oxide semiconductor film 112 over an insulating film 111 formed over a substrate 101, conductive films 114 and 116 and an insulating film 117 which are in contact with the oxide semiconductor film 112, and a conductive film 118 overlapping with the oxide semiconductor film 112 with the insulating film 117 provided therebetween. Note that an insulating film 120 is provided over the transistor 100A.

The transistor 100B illustrated in FIGS. 9A and 9B includes an oxide semiconductor film 103 over the insulating film 111 formed over the substrate 101, conductive films 104 and 105 and an insulating film 106 which are in contact with the oxide semiconductor film 103, and a conductive film 107 overlapping with the oxide semiconductor film 103 with the insulating film 106 provided therebetween. Note that the insulating film 120 is provided over the transistor 100B.

The transistor 100B includes the conductive film 102 overlapping with the oxide semiconductor film 103 with the insulating film 111 provided therebetween. In other words, the conductive film 102 functions as a gate electrode. The transistor 100B is a dual-gate transistor. The other structures are the same as those of the transistor 100A and the effect similar to that in the case of the transistor 100A can be obtained.

The threshold voltage value of the transistor 100B can be controlled by applying different potentials to the conductive film 102 and the conductive film 107. On the other hand, as illustrated in FIG. 9B, by applying the same potentials to the conductive film 102 and the conductive film 107, an on-state current can be increased, variations in the initial characteristics can be reduced, and degradation of the transistor 100B due to the −GBT stress test and a change in the rising voltage of the on-state current at different drain voltages can be suppressed.

In the display device, the structure of a transistor in the column driver 59/the row driver 60 differs from that in the display portion 54. The transistor included in the column driver 59/the row driver 60 is a dual-gate transistor. That is, the transistor included in the column driver 59/the row driver 60 has a higher on-state current than that included in the display portion 54.

In addition, the transistor in the column driver 59/the row driver 60 and the transistor in the display portion 54 may have different channel lengths.

Typically, the channel length of the transistor 100B included in the column driver 59/the row driver 60 can be set to be less than 2.5 µm, or greater than or equal to 1.45 µm and less than or equal to 2.2 µm. On the other hand, the channel length of the transistor 100A included in the display portion 54 can be set to be greater than or equal to 2.5 µm, or greater than or equal to 2.5 µm and less than or equal to 20 µm.

When the channel length of the transistor 100B included in the column driver 59/the row driver 60 is set to be less than 2.5 µm, or preferably greater than or equal to 1.45 µm and less than or equal to 2.2 µm, the on-state current can be increased as compared with the transistor 100A included in the display portion 54. Consequently, the column driver 59/the row driver 60 can operate at high speed.

Regions of the oxide semiconductor film 112 not overlapping with the conductive films 114 and 116 and the conductive film 118 each include an element which forms an oxygen vacancy. In addition, regions of the oxide semiconductor film 103 not overlapping with the conductive films 104 and 105 and the conductive film 107 each include an element which forms an oxygen vacancy. The element which forms oxygen vacancy is described below as an impurity element. Typical examples of an impurity element are hydrogen, a rare gas element, and the like. Typical examples of a rare gas element are helium, neon, argon, krypton, and xenon. Furthermore, boron, carbon, nitrogen, fluorine, aluminum, silicon, phosphorus, chlorine, or the like may be contained in the oxide semiconductor film 112 and the oxide semiconductor film 103 as an impurity element.

In addition, the insulating film 120 is a film containing hydrogen and is typically a nitride insulating film. The insulating film 120 is in contact with the oxide semiconductor film 112 and the oxide semiconductor film 103, whereby hydrogen contained in the insulating film 120 is diffused to the oxide semiconductor film 112 and the oxide semiconductor film 103. Consequently, much hydrogen is contained in the regions of the oxide semiconductor film 112 and the oxide semiconductor film 103 in contact with the insulating film 120.

When a rare gas element is added as an impurity element to the oxide semiconductor film, a bond between a metal element and oxygen in the oxide semiconductor film is cut, whereby an oxygen vacancy is formed. By interaction between hydrogen and the oxygen vacancy included in the oxide semiconductor film, the conductivity of the oxide semiconductor film is increased. Specifically, hydrogen enters into the oxygen vacancies in the oxide semiconductor film, whereby a carrier (an electron) is produced. As a result, the conductivity is increased.

Figure 10A:
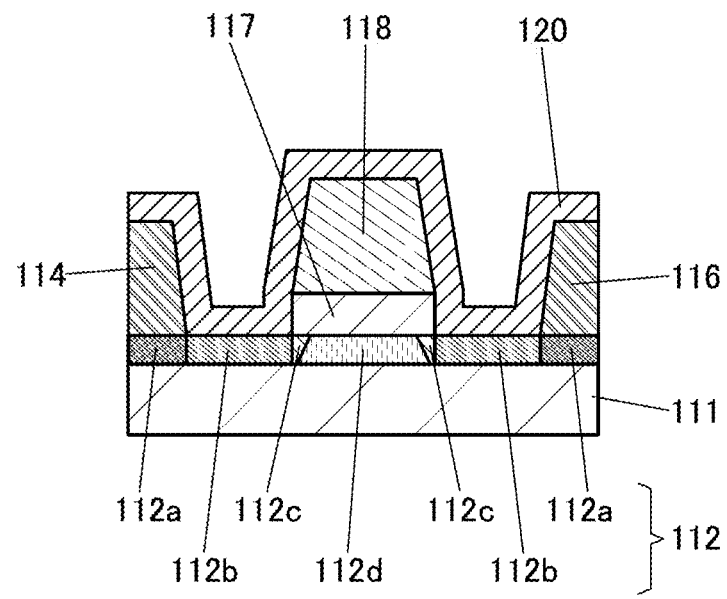
FIGS. 10A and 10B are cross-sectional views of transistors.
Figure 10B:
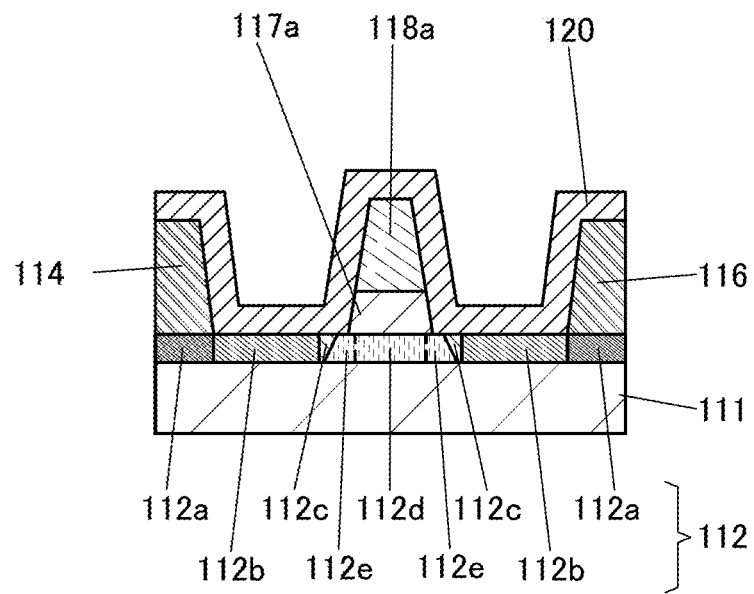

Here, FIGS. 10A and 10B are each a partial enlarged view of the oxide semiconductor film 112. Note that as typical examples, description is made with reference to the partial enlarged views of the oxide semiconductor film 112 included in the transistor 100A. As illustrated in FIGS. 10A and 10B, the oxide semiconductor film 112 includes regions 112a in contact with the conductive films 114 and 116, regions 112b in contact with the insulating film 120, and a region 112d in contact with the insulating film 117. Note that in the case where the conductive film 118 has a tapered side surface, the oxide semiconductor film 112 may include a region 112c overlapping with a tapered portion of the conductive film 118.

The regions 112a function as a source region and a drain region. In the case where the conductive films 114 and 116 are formed using a conductive material that is easily bonded to oxygen, such as tungsten, titanium, aluminum, copper, molybdenum, chromium, tantalum, or an alloy of any of these conductive materials, oxygen contained in the oxide semiconductor film and the conductive materials contained in the conductive films 114 and 116 are bonded to each other; thus, oxygen vacancies are formed in the oxide semiconductor film. Furthermore, in some cases, part of constituent elements of the conductive material that forms the conductive films 114 and 116 is mixed into the oxide semiconductor film. As a result, the region 112a in contact with the conductive film 114 or 116 has higher conductivity and accordingly functions as a source region or a drain region.

The region 112b functions as a low-resistance region. The region 112b contains at least a rare gas and hydrogen as impurity elements. Note that in the case where the conductive film 118 has a tapered side surface, the impurity element is added to the region 112c through the tapered portion of the conductive film 118; therefore, the region 112c contains the impurity element, though the concentration of the rare gas element which is an example of the impurity element of the region 112c is lower than that in the region 112b. With the regions 112c, source-drain breakdown voltage of the transistor can be increased.

In the case where the oxide semiconductor film 112 formed by a sputtering method, the regions 112a to 112d each contain the rare gas element, and the concentrations of the rare gas elements in the regions 112b and 112c are higher than those in the regions 112a and 112d. The reasons are as follows: in the case where the oxide semiconductor film 112 is formed by a sputtering method, a rare gas is used as a sputtering gas, so that the oxide semiconductor film 112 contains the rare gas; and a rare gas is intentionally added to the regions 112b and 112c in order to form oxygen vacancies in the regions 112b and 112c. Note that a rare gas element different from that in the regions 112a and 112d may be added to the regions 112b and 112c.

Since the region 112b is in contact with the insulating film 120, the concentration of hydrogen in the region 112b is higher than those in the regions 112a and 112d. In addition, in the case where hydrogen is diffused from the region 112b to the region 112c, the concentration of hydrogen in the region 112c is higher than those in the regions 112a and 112d. However, the concentration of hydrogen in the region 112b is higher than that in the region 112c.

In the regions 112b and 112c, the concentrations of hydrogen measured by secondary ion mass spectrometry (SIMS) can be greater than or equal to $8\times10^{19}$ atoms/cm$^3$, greater than or equal to $1\times10^{20}$ atoms/cm$^3$, or greater than or equal to $5\times10^{20}$ atoms/cm$^3$. Note that the concentrations of hydrogen in the regions 112a and 112d which are measured by secondary ion mass spectrometry can be less than or equal to $5\times10^{19}$ atoms/cm$^3$, less than or equal to $1\times10^{19}$ atoms/cm$^3$, less than or equal to $5\times10^{18}$ atoms/cm$^3$, less than or equal to $1\times10^{18}$ atoms/cm$^3$, less than or equal to $5\times10^{17}$ atoms/cm$^3$, or less than or equal to $1\times10^{16}$ atoms/cm$^3$.

In the case where boron, carbon, nitrogen, fluorine, aluminum, silicon, phosphorus, or chlorine is added to the oxide semiconductor film 112 as an impurity element, only the regions 112b and 112c contain the impurity element. Therefore, the concentrations of the impurity element in the regions 112b and 112c are higher than those in the regions 112a and 112d. Note that the concentrations of the impurity element in the regions 112b and 112c which are measured by secondary ion mass spectrometry can be greater than or equal to $1\times10^{18}$ atoms/cm$^3$ and less than or equal to $1\times10^{22}$ atoms/cm$^3$, greater than or equal to $1\times10^{19}$ atoms/cm$^3$ and less than or equal to $1\times10^{21}$ atoms/cm$^3$, or greater than or equal to $5\times10^{19}$ atoms/cm$^3$ and less than or equal to $5\times10^{20}$ atoms/cm$^3$.

The regions 112b and 112c have higher concentrations of hydrogen and larger amounts of oxygen vacancies due to addition of the rare gas element than the region 112d. Therefore, the regions 112b and 112c have higher conductivity and function as low-resistance regions. The resistivity of the regions 112b and 112c can be typically greater than or equal to $1\times10^{-3}$ Ωcm and less than $1\times10^{4}$ Ωcm, or greater than or equal to $1\times10^{-3}$ Ωcm and less than $1\times10^{-1}$ Ωcm.

Note that when the amount of hydrogen in each of the regions 112b and 112c is the same as or smaller than the amount of oxygen vacancies therein, hydrogen is easily captured by oxygen vacancies and is less likely to be diffused to the region 112d serving as a channel. As a result, a transistor having normally-off characteristics can be obtained.

The region 112d functions as a channel.

In addition, after the impurity element is added to the oxide semiconductor film 112 using the conductive films 114, 116, and 118 as masks, the area of the conductive film 118 when seen from the above may be reduced. A slimming process is performed on a mask over the conductive film 118 in a step of forming the conductive film 118 to obtain a mask with a minuter structure. Then, the conductive film 118 and the insulating film 117 are etched using the mask, so that a conductive film 118a and an insulating film 117a illustrated in FIG. 10B can be formed. As the slimming process, an ashing process using an oxygen radical or the like can be employed, for example.

As a result, an offset region 112e is formed between the region 112c and the region 112d serving as a channel in the oxide semiconductor film 112. Note that the length of the offset region 112e in the channel length direction is set to be less than 0.1 μm, whereby a decrease in the on-state current of the transistor can be suppressed.

The insulating film 117 and the insulating film 106 each function as a gate insulating film.

The conductive films 114 and 116 and the conductive films 104 and 105 each function as a source electrode or a drain electrode.

The conductive film 118 and the conductive film 107 each function as a gate electrode.

The transistor 100A and the transistor 100B described in this embodiment each include the region 112b and/or the region 112c between the region 112d functioning as a channel and each of the regions 112a functioning as a source region and a drain region. Accordingly, resistance between the channel and each of the source region and the drain region can be reduced, and the transistor 100A and the transistor 100B each have a high on-state current and a high field-effect mobility.

In addition, in the transistor 100A and the transistor 100B, parasitic capacitance between the conductive film 118 and each of the conductive films 114 and 116 can be reduced by forming the conductive film 118 so as not overlap with the conductive films 114 and 116. Moreover, parasitic capacitance between the conductive film 107 and each of the conductive films 104 and 105 can be reduced by forming the conductive film 107 so as not to overlap with the conductive films 104 and 105. As a result, in the case where a large-sized substrate is used as the substrate 101, signal delays in the conductive films 114 and 116 and the conductive film 118, and signal delays in the conductive films 104 and 105 and the conductive film 107 can be reduced.

In the transistor 100A, the rare gas element is added to the oxide semiconductor film 112 using the conductive films 114 and 116 and the conductive film 118 as masks, so that regions having oxygen vacancies are formed. In the transistor 100B, the impurity element is added to the oxide semiconductor film 103 using the conductive films 104 and 105 and the conductive film 107 as masks, so that regions having oxygen vacancies are formed. Furthermore, the regions having oxygen vacancies are in contact with the insulating film 120 containing hydrogen; therefore, hydrogen contained in the insulating film 120 is diffused to the regions having oxygen vacancies and thus low-resistance regions are formed. That is, the low-resistance regions can be formed in a self-aligned manner.

In the transistor 100A and the transistor 100B described in this embodiment, when the rare gas is added to the regions 112b, oxygen vacancies are formed and hydrogen is added thereto. Therefore, the conductivity of the region 112b can be increased and variation in conductivity of the region 112b in each transistor can be reduced. That is, addition of the rare gas and hydrogen to the region 112b can control the conductivity of the region 112b.

The structure illustrated in FIGS. 9A and 9B is described below in detail.

The type of the substrate 101 is not limited to a certain type, and any of a variety of substrates can be used as the substrate 101. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of a glass substrate include a barium borosilicate glass substrate, an aluminoborosilicate glass substrate, and a soda lime glass substrate. Examples of a flexible substrate, an attachment film, a base material film, or the like are as follows: plastic typified by polyethylene terephthalate (PET), polyethylene naphthalate (PEN), and polyether sulfone (PES); a synthetic resin such as acrylic; polypropylene; polyester; polyvinyl fluoride; vinyl chloride; polyamide; polyimide; aramid; epoxy; an inorganic vapor deposition film; and paper. Specifically, when the transistors are formed using a semiconductor substrate, a single crystal substrate, an SOI substrate, or the like, it is possible to form a transistor with few variations in characteristics, size, shape, or the like, with high current supply capability, and with a small size. By forming a circuit with the use of such a transistor, power consumption of the circuit can be reduced or the circuit can be highly integrated.

Still alternatively, a flexible substrate may be used as the substrate 101, and the transistors may be directly provided on the flexible substrate. Alternatively, a separation layer may be provided between the substrate 101 and each of the transistors. The separation layer can be used when part or the whole of a semiconductor device formed over the separation layer is completed and separated from the substrate 101 and transferred to another substrate. In such a case, the transistors can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

Examples of a substrate to which the transistors are transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. When such a substrate is used, a transistor with excellent properties or a transistor with low power consumption can be formed, a device with high durability, high heat resistance can be provided, or reduction in weight or thickness can be achieved.

The insulating film 111 can be formed with a single layer or a stack using one or more of an oxide insulating film and a nitride insulating film. Note that an oxide insulating film is preferably used as at least a region of the insulating film 111 that is in contact with the oxide semiconductor films 103 and 112, in order to improve characteristics of the interface with the oxide semiconductor films 103 and 112. An oxide insulating film that releases oxygen by being heated is preferably used as the insulating film 111, in which case oxygen contained in the insulating film 111 can be moved to the oxide semiconductor films 103 and 112 by heat treatment.

The thickness of the insulating film 111 can be greater than or equal to 50 nm, greater than or equal to 100 nm and less than or equal to 3000 nm, or greater than or equal to 200 nm and less than or equal to 1000 nm. With the use of the thick insulating film 111, the amount of oxygen released from the insulating film 111 can be increased, and the interface states between the insulating film 111 and each of the oxide semiconductor films 103 and 112 and oxygen vacancies included in the regions 112d of the oxide semiconductor films 103 and 112 can be reduced.

The insulating film 111 can be formed with a single layer or a stack using, for example, one or more of silicon oxide, silicon oxynitride, silicon nitride oxide, silicon nitride, aluminum oxide, hafnium oxide, gallium oxide, a Ga—Zn oxide, and the like.

The oxide semiconductor films 112 and 103 are typically formed using a metal oxide such as an In—Ga oxide, an In—Zn oxide, or an In-M-Zn oxide (M is Mg, Al, Ti, Ga, Y, Zr, La, Ce, Nd, or Hf). Note that the oxide semiconductor films 112 and 103 have light-transmitting properties.

Note that in the case of using an In-M-Zn oxide as the oxide semiconductor films 112 and 103, when the summation of In and M is assumed to be 100 atomic %, the proportions of In and M are preferably set to be greater than or equal to 25 atomic % and less than 75 atomic %, respectively, or greater than or equal to 34 atomic % and less than 66 atomic %, respectively.

The energy gaps of the oxide semiconductor films 112 and 103 are each 2 eV or more, 2.5 eV or more, or 3 eV or more.

The thicknesses of the oxide semiconductor films 112 and 103 are each greater than or equal to 3 nm and less than or equal to 200 nm, greater than or equal to 3 nm and less than or equal to 100 nm, or greater than or equal to 3 nm and less than or equal to 50 nm.

In the case where the oxide semiconductor films 112 and 103 are each an In-M-Zn oxide (M is Mg, Al, Ti, Ga, Y, Zr, La, Ce, Nd, or Hf), it is preferable that the atomic ratio of metal elements of a sputtering target used for forming a film of the In-M-Zn oxide satisfy In≥M and Zn≥M. As the atomic ratio of metal elements of the sputtering target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, or the like is preferable. Note that the atomic ratios of metal elements in the formed oxide semiconductor films 112 and 103 vary from the above atomic ratio of metal elements of the sputtering target within a range of ±40% as an error.

When silicon or carbon that is one of elements belonging to Group 14 is contained in the oxide semiconductor films 112 and 103, oxygen vacancies are increased in the oxide semiconductor films 112 and 103, and the oxide semiconductor films 112 and 103 become n-type films. Thus, the concentrations of silicon or carbon (the concentrations are measured by secondary ion mass spectrometry (SIMS)) of the oxide semiconductor films 112 and 103, in particular, the regions 112$d$ can be less than or equal to $2\times10^{18}$ atoms/cm$^3$ or less than or equal to $2\times10^{17}$ atoms/cm$^3$. As a result, the transistors each have a positive threshold voltage value (normally-off characteristics).

In addition, the concentrations of alkali metals or alkaline earth metals measured by secondary ion mass spectrometry (SIMS) of the oxide semiconductor films 112 and 103, in particular, the regions 112$d$ can be less than or equal to $1\times10^{18}$ atoms/cm$^3$ or less than or equal to $2\times10^{16}$ atoms/cm$^3$. An alkali metal and an alkaline earth metal might generate carriers when bonded to an oxide semiconductor, in which case the off-state current of the transistors might be increased. Therefore, it is preferable to reduce the concentration of an alkali metal or an alkaline earth metal in the region 112$d$. As a result, the transistors each have a positive threshold voltage value (normally-off characteristics).

Furthermore, when containing nitrogen, each of the oxide semiconductor films 112 and 103, in particular, the regions 112$d$ might become an n-type film by generation of electrons serving as carriers and an increase of carrier density. Thus, the transistor including an oxide semiconductor film which contains nitrogen is likely to have normally-on characteristics. For this reason, nitrogen in the oxide semiconductor film, in particular, the region 112$d$ can be reduced as much as possible. The concentration of nitrogen measured by secondary ion mass spectrometry (SIMS) can be set to be, for example, less than or equal to $5\times10^{18}$ atoms/cm$^3$.

When an impurity element in each of the oxide semiconductor films 112 and 103, in particular, the regions 112$d$ is reduced, the carrier density of the oxide semiconductor film can be lowered. Thus, each of the oxide semiconductor films 112 and 103, in particular, the regions 112$d$ can have a carrier density greater than or equal to $1\times10^{-9}$/cm$^3$ and less than or equal to $1\times10^{17}$/cm$^3$, greater than or equal to $1\times10^{-9}$/cm$^3$ and less than or equal to $1\times10^{15}$/cm$^3$, greater than or equal to $1\times10^{-9}$/cm$^3$ and less than or equal to $1\times10^{13}$/cm$^3$, greater than or equal to $1\times10^{-9}$/cm$^3$ and less than $8\times10^{11}$/cm$^3$, greater than or equal to $1\times10^{-9}$/cm$^3$ and less than or equal to $1\times10^{11}$/cm$^3$, or greater than or equal to $1\times10^{-9}$/cm$^3$ and less than $1\times10^{10}$/cm$^3$.

An oxide semiconductor film with a low impurity concentration and a low density of defect states can be used for the oxide semiconductor films 112 and 103, in which case the transistors can have more excellent electrical characteristics. Here, the state in which impurity concentration is low and density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed is likely to have a positive threshold voltage value (normally-off characteristics). A highly purified intrinsic or substantially highly purified intrinsic oxide semiconductor film has a low density of defect states and accordingly has low density of trap states in some cases. Furthermore, a highly purified intrinsic or substantially highly purified intrinsic oxide semiconductor film has an extremely small off-state current; the off-state current can be smaller than or equal to the measurement limit of a semiconductor parameter analyzer, i.e., smaller than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases.

In addition, each of the oxide semiconductor films 112 and 103 may have a non-single-crystal structure, for example. The non-single crystal structure includes a c-axis aligned crystalline oxide semiconductor (CAAC-OS) described later, a polycrystalline structure, a microcrystalline structure described later, or an amorphous structure, for example. Among the non-single crystal structure, the amorphous structure has the highest density of defect states, whereas CAAC-OS has the lowest density of defect states.

Note that the oxide semiconductor films 112 and 103 may be a mixed film including two or more of the following: a region having an amorphous structure, a region having a microcrystalline structure, a region having a polycrystalline structure, a region of CAAC-OS, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, the mixed film has a stacked-layer structure including, for example, two or more of a region having an amorphous structure, a region having a microcrystalline structure, a region having a polycrystalline structure, a CAAC-OS region, and a region having a single-crystal structure in some cases.

Note that in some cases, the regions 112b and 112d are different in crystallinity in each of the oxide semiconductor films 112 and 103. In addition, in some cases, the regions 112c and 112d are different in crystallinity in each of the oxide semiconductor films 112 and 103. This is because when an impurity element is added to the region 112b or 112c, the region 112b or 112c is damaged and thus has lower crystallinity.

The insulating films 106 and 117 can be formed with a single layer or a stack using one or more of an oxide insulating film and a nitride insulating film. Note that an oxide insulating film is preferably used as at least regions of the insulating films 106 and 117 that are in contact with the oxide semiconductor films 112 and 103, respectively, in order to improve characteristics of the interface with the oxide semiconductor films 112 and 103. The insulating films 106 and 117 can be formed with a single layer or a stack using, for example, one or more of silicon oxide, silicon oxynitride, silicon nitride oxide, silicon nitride, aluminum oxide, hafnium oxide, gallium oxide, a Ga—Zn oxide, and the like.

Furthermore, it is possible to prevent outward diffusion of oxygen from the oxide semiconductor films 112 and 103 and entry of hydrogen, water, or the like into the oxide semiconductor films 112 and 103 from the outside by providing an insulating film having a blocking effect against oxygen, hydrogen, water, and the like as the insulating films 106 and 117. As the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

The insulating films 106 and 117 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistors can be reduced.

An oxide insulating film that releases oxygen by being heated is preferably used as the insulating films 106 and 117, in which case oxygen contained in the insulating films 106 and 117 can be moved to the oxide semiconductor films 103 and 112, respectively, by heat treatment.

In addition, a silicon oxynitride film with few defects can be used as the insulating films 106 and 117. In an ESR spectrum at 100 K or lower of the silicon oxynitride film with few defects, after heat treatment, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. In the silicon oxynitride film with few defects, the total spin density of the first to third signals is less than $1 \times 10^{18}$ spins/cm$^3$, typically greater than or equal to $1 \times 10^{17}$ spins/cm$^3$ and less than $1 \times 10^{18}$ spins/cm$^3$.

The first signal, the second signal, and the third signal correspond to signals attributed to nitrogen oxide (NO$_x$; x is greater than or equal to 0 and less than or equal to 2, or greater than or equal to 1 and smaller than or equal to 2). In other words, the lower the total spin density of the first to third signals is, the lower the content of nitrogen oxide in the silicon oxynitride film is.

The concentration of nitrogen in the silicon oxynitride film with few defects which is measured by secondary ion mass spectrometry is less than or equal to $6 \times 10^{20}$ atoms/cm$^3$. With the use of the silicon oxynitride film with few defects as the insulating film 117, a nitrogen oxide is unlikely to be generated, so that the carrier trap at the interface between the insulating film and each of the oxide semiconductor films 112 and 103 can be inhibited. Furthermore, a shift in the threshold voltage value of each of the transistors included in the display device can be reduced, which leads to a smaller change in the electrical characteristics of the transistors.

The total thickness of the insulating films 106 and 117 can be greater than or equal to 5 nm and less than or equal to 400 nm, greater than or equal to 5 nm and less than or equal to 300 nm, or greater than or equal to 10 nm and less than or equal to 250 nm.

Each of the conductive films 114 and 116, the conductive film 118, the conductive films 104 and 105, the conductive film 102, and the conductive film 107 can be formed using a metal element selected from aluminum, chromium, copper, tantalum, titanium, molybdenum, nickel, iron, cobalt, and tungsten; an alloy containing any of these metal elements as a component; an alloy containing these metal elements in combination; or the like. Furthermore, one or more metal elements selected from manganese and zirconium may be used. The conductive films 114 and 116, the conductive film 118, the conductive films 104 and 105, the conductive film 102, and the conductive film 107 may have a single-layer structure or a stacked-layer structure of two or more layers. For example, any of the following can be used: a single-layer structure of an aluminum film containing silicon; a single-layer structure of a copper film containing manganese; two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film which contains aluminum and one or more elements selected from titanium, tantalum, tungsten, molybdenum, chromium, neodymium, and scandium may be used.

The conductive films 114 and 116, the conductive film 118, the conductive films 104 and 105, the conductive film 102, and the conductive film 107 each can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Alternatively, a stacked-layer structure of the above light-transmitting conductive material and a conductive material containing the above metal element may be employed.

The thicknesses of the conductive films 114 and 116, the conductive film 118, the conductive films 104 and 105, the conductive film 102, and the conductive film 107 each can be greater than or equal to 30 nm and less than or equal to 500 nm, or greater than or equal to 100 nm and less than or equal to 400 nm.

The insulating film 120 is a film containing hydrogen and is typically a nitride insulating film. The nitride insulating film can be formed using silicon nitride, aluminum nitride, or the like.

<Structure Example 2 of Transistor>

Next, another structure of the transistor included in the display device is described with reference to FIGS. 11A to 11C. Description is made here using a transistor 100C as a modified example of the transistor 100A provided in the display portion 54; however, the structure of an insulating film 111 or the structure of a conductive film 114, 116, or 118 of the transistor 100C can be applied as appropriate to the transistor 100B in the column driver 59/the row driver 60.

Figure 11A:
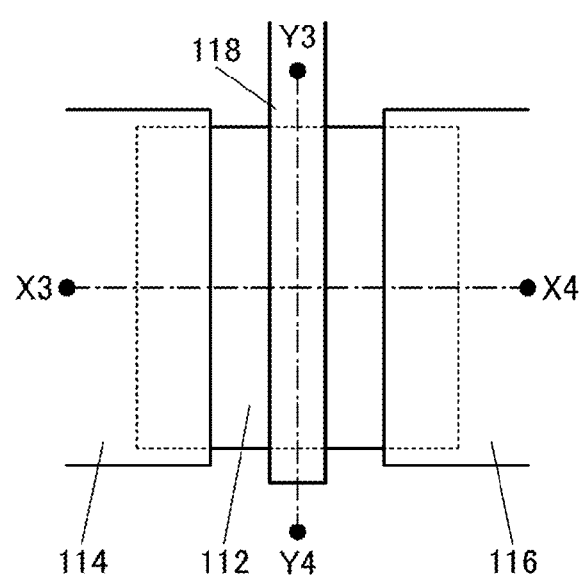
FIGS. 11A to 11C are a top view and cross-sectional views of a transistor.
Figure 11B:
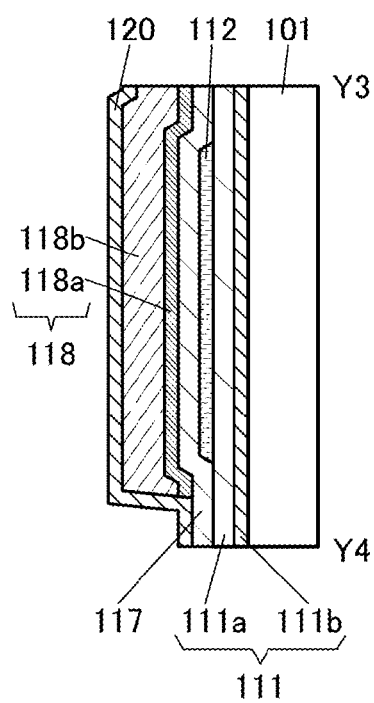
Figure 11C:
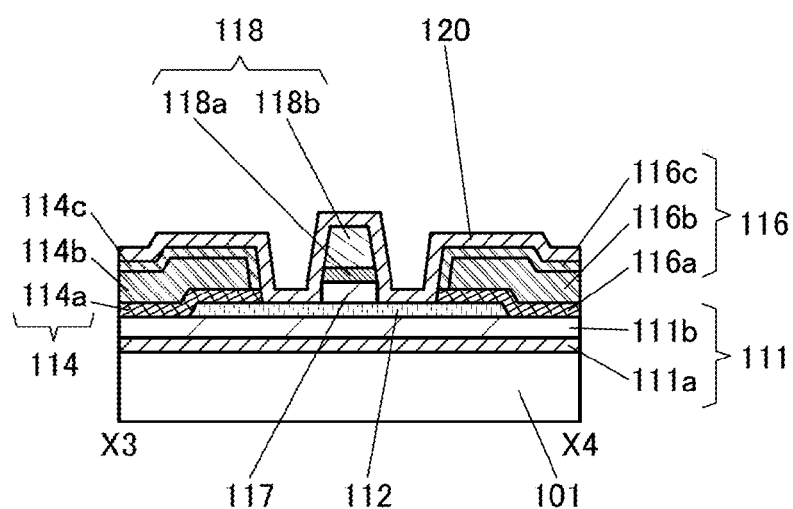

FIGS. 11A to 11C are a top view and cross-sectional views of the transistor 100C included in the display device. FIG. 11A is a top view of the transistor 100C, FIG. 11B is a cross-sectional view taken along dashed-dotted line Y3-Y4 in FIG. 11A, and FIG. 11C is a cross-sectional view taken along dashed-dotted line X3-X4 in FIG. 11A.

The transistor 100C illustrated in FIGS. 11A to 11C has a two- or three-layer structure of the conductive films 114 and 116 and the conductive film 118. In addition, the insulating film 111 has a stacked-layer structure of a nitride insulating film 111a and an oxide insulating film 111b. The other structures are the same as those of the transistor 100A and the effect similar to that in the case of the transistor 100A can be obtained.

First, the conductive films 114 and 116 and the conductive film 118 are described.

In the conductive film 114, conductive films 114a, 114b, and 114c are stacked in this order and the conductive films 114a and 114c cover the surfaces of the conductive film 114b. That is, the conductive films 114a and 114c function as protective films of the conductive film 114b.

In a manner similar to that of the conductive film 114, in the conductive film 116, conductive films 116a, 116b, and 116c are stacked in this order and the conductive films 116a and 116c cover the surfaces of the conductive film 116b. That is, the conductive films 116a and 116c function as protective films of the conductive film 116b.

In the conductive film 118, conductive films 118a and 118b are stacked in this order.

The conductive films 114a and 116a and the conductive film 118a are formed using materials that prevent metal elements contained in the conductive films 114b and 116b and the conductive film 118b, respectively, from diffusing to the oxide semiconductor film 112. The conductive films 114a and 116a and the conductive film 118a can be formed using titanium, tantalum, molybdenum, tungsten, an alloy of any of these materials, titanium nitride, tantalum nitride, molybdenum nitride, tantalum nitride, or the like. Alternatively, the conductive films 114a and 116a and the conductive film 118a can be formed using Cu—X alloy (X is Mn, Ni, Cr, Fe, Co, Mo, Ta, or Ti) or the like.

The conductive films 114b and 116b and the conductive film 118b are each formed using a low-resistance material. The conductive films 114b and 116b and the conductive film 118b can be formed using copper, aluminum, gold, silver, an alloy of any of these materials, a compound containing any of these materials as a main component, or the like.

When the conductive films 114c and 116c are formed using films in which the metal elements contained in the conductive films 114b and 116b, respectively, are passivated, the metal elements contained in the conductive films 114b and 116b can be prevented from moving to the oxide semiconductor film 112 in a step of forming the insulating film 128. The conductive films 114c and 116c can be formed using a metal silicide or a metal silicide nitride, typically, $CuSi_x$ (x>0), $CuSi_xN_y$ (x>0, y>0), or the like.

Here, a method for forming the conductive films 114c and 116c is described. Note that the conductive films 114b and 116b are formed using copper. In addition, the conductive films 114c and 116c are formed using $CuSi_xN_y$ (x>0, y>0).

The conductive films 114b and 116b are exposed to plasma generated in a reducing atmosphere such as a hydrogen atmosphere, an ammonia atmosphere, or a carbon monoxide atmosphere and the oxide formed on the surfaces of the conductive films 114b and 116b are reduced.

Next, the conductive films 114b and 116b are exposed to silane while being heated at a temperature higher than or equal to 200° C. and lower than or equal to 400° C. As a result, copper contained in the conductive films 114b and 116b acts as a catalyst, and silane is decomposed into Si and Hz, and $CuSi_x$ (x>0) is formed on the surfaces of the conductive films 114b and 116b.

Next, the conductive films 114b and 116b are exposed to plasma generated in an atmosphere containing nitrogen, such as an ammonia atmosphere or a nitrogen atmosphere, whereby $CuSi_x$ (x>0) formed on the surfaces of the conductive films 114b and 116b reacts with nitrogen contained in the plasma and accordingly $CuSi_xN_y$ (x>0, y>0) is formed as the conductive films 114c and 116c.

Note that in the above step, $CuSi_xN_y$ (x>0, y>0) may be formed as the conductive films 114c and 116c in such a manner that the conductive films 114b and 116b are exposed to plasma generated in an atmosphere containing nitrogen, such as an ammonia atmosphere or a nitrogen atmosphere, and then exposed to silane while being heated at a temperature higher than or equal to 200° C. and lower than or equal to 400° C.

Next, the insulating film 111 in which the nitride insulating film 111a and the oxide insulating film 111b are stacked is described.

The nitride insulating film 111a can be formed using silicon nitride, silicon nitride oxide, aluminum nitride, or aluminum nitride oxide, for example. The oxide insulating film 111b can be formed using silicon oxide, silicon oxynitride, aluminum oxide, or the like, for example. The structure in which the nitride insulating film 111a is provided on the substrate 101 side can prevent hydrogen, water, or the like from diffusing to the oxide semiconductor film 112 from the outside.

<Structure Example 3 of Transistor>

Next, another structure of the transistor included in the display device is described with reference to FIGS. 12A to 12C and FIGS. 13A to 13C. Description is made here using a transistor 100D and a transistor 100E as modified examples of the transistor 100A provided in the display portion 54; however, the structure of an oxide semiconductor film 112 included in the transistor 100D or the structure of an oxide semiconductor film 112 included in the transistor 100E can be applied as appropriate to the transistor 100B in the column driver 59/the row driver 60.

Figure 12A:
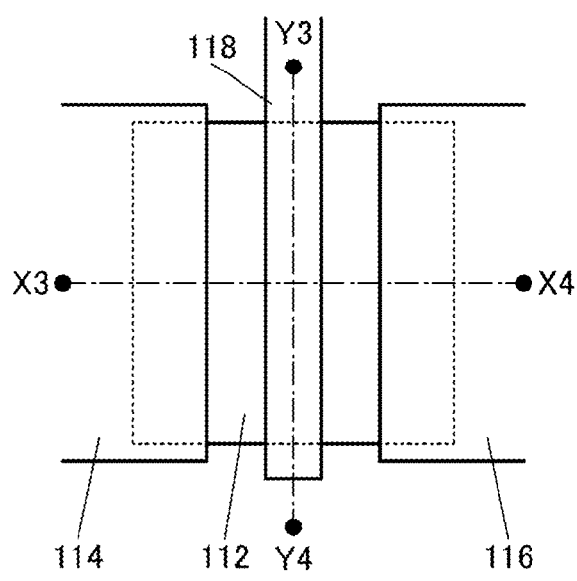
FIGS. 12A to 12C are a top view and cross-sectional views of a transistor.
Figure 12B:
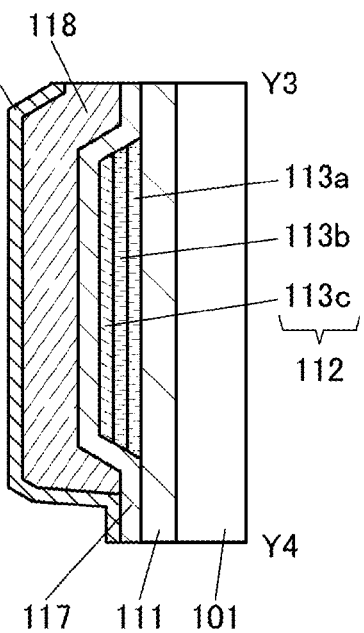
Figure 12C:
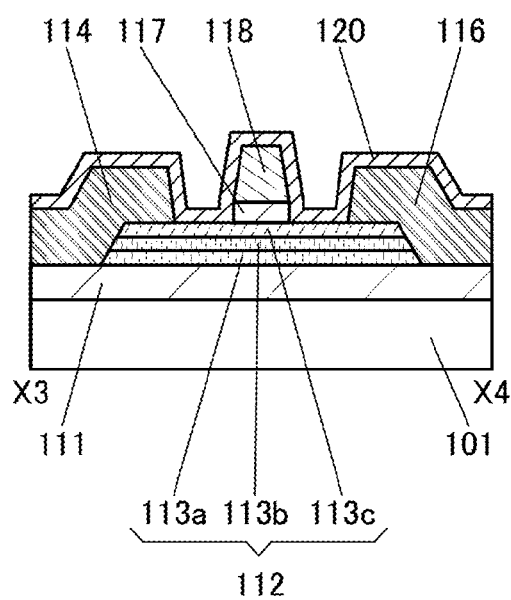

FIGS. 12A to 12C are a top view and cross-sectional views of the transistor 100D included in the display device. FIG. 12A is a top view of the transistor 100D, FIG. 12B is a cross-sectional view taken along dashed-dotted line Y3-Y4 in FIG. 12A, and FIG. 12C is a cross-sectional view taken along dashed-dotted line X3-X4 in FIG. 12A.

The oxide semiconductor film 112 of the transistor 100D illustrated in FIGS. 12A to 12C has a multilayer structure. Specifically, the oxide semiconductor film 112 includes an oxide semiconductor film 113a in contact with the insulating film 111, an oxide semiconductor film 113b in contact with the oxide semiconductor film 113a, and an oxide semiconductor film 113c in contact with the oxide semiconductor film 113b, the conductive films 114 and 116, and the insulating films 117 and 120. The other structures are the same as those of the transistor 100A and the effect similar to that in the case of the transistor 100A can be obtained.

The oxide semiconductor films 113a, 113b, and 113c are typically formed using a metal oxide such as an In—Ga oxide, an In—Zn oxide, or an In-M-Zn oxide (M is Mg, Al, Ti, Ga, Y, Zr, La, Ce, Nd, or Hf).

The oxide semiconductor films 113a and 113c are typically each an In—Ga oxide, an In—Zn oxide, an In—Mg oxide, a Zn—Mg oxide, or an In-M-Zn oxide (M is Mg, Al, Ti, Ga, Y, Zr, La, Ce, Nd, or Hf), and has the energy at the bottom of the conduction band closer to a vacuum level than that of the oxide semiconductor film 113b. Typically, a difference between the energy at the bottom of the conduction band of the oxide semiconductor film 113b and the energy at the bottom of the conduction band of each of the oxide semiconductor films 113a and 113c is greater than or equal to 0.05 eV, greater than or equal to 0.07 eV, greater than or equal to 0.1 eV, or greater than or equal to 0.2 eV and also less than or equal to 2 eV, less than or equal to 1 eV, less than or equal to 0.5 eV, or less than or equal to 0.4 eV. Note that the difference between the vacuum level and the energy at the bottom of the conduction band is referred to as electron affinity.

In the case where the oxide semiconductor film 113b is an In-M-Zn oxide (M is Mg, Al, Ti, Ga, Y, Zr, La, Ce, Nd, or Hf) and a target having the atomic ratio of metal elements of In:M:Zn=$x_1$:$y_1$:$z_1$ is used for depositing the oxide semiconductor film 113b, $x_1/y_1$ is preferably greater than or equal to ⅓ and less than or equal to 6, or further preferably greater than or equal to 1 and less than or equal to 6, and $z_1/y_1$ is preferably greater than or equal to ⅓ and less than or equal to 6, or further preferably greater than or equal to 1 and less than or equal to 6. Note that when $z_1/y_1$ is greater than or equal to 1 and less than or equal to 6, a CAAC-OS film to be described later as the oxide semiconductor film 113b is easily formed. As typical examples of the atomic ratio of metal elements of the target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, and the like can be given.

In the case where the oxide semiconductor films 113a and 113c are each an In-M-Zn oxide (M is Mg, Al, Ti, Ga, Y, Zr, La, Ce, Nd, or Hf) and a target having the atomic ratio of metal elements of In:M:Zn=$x_2$:$y_2$:$z_2$ is used for forming the oxide semiconductor films 113a and 113c, $x_2/y_2$ is preferably less than $x_1/y_1$, and $z_2/y_2$ is preferably greater than or equal to ⅓ and less than or equal to 6, or further preferably greater than or equal to 1 and less than or equal to 6. Note that when $z_2/y_2$ is greater than or equal to 1 and less than or equal to 6, a CAAC-OS film to be described later as the oxide semiconductor films 113a and 113c is easily formed. As typical examples of the atomic ratio of metal elements of the target, In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:6:3, In:M:Zn=1:6:4, In:M:Zn=1:6:5, In:M:Zn=1:6:6, In:M:Zn=1:6:7, In:M:Zn=1:6:8, In:M:Zn=1:6:9, and the like can be given.

Note that a proportion of each atom in the atomic ratio of the oxide semiconductor films 113a, 113b, and 113c varies within a range of ±40% as an error.

The atomic ratio is not limited to the above, and the atomic ratio may be appropriately set in accordance with needed semiconductor characteristics.

The oxide semiconductor films 113a and 113c may have the same composition. For example, as the oxide semiconductor films 113a and 113c, an In—Ga—Zn oxide having an atomic ratio of In:Ga:Zn=1:3:2, 1:3:4, 1:4:5, 1:4:6, 1:4:7, or 1:4:8 may be used.

Alternatively, the oxide semiconductor films 113a and 113c may have different compositions. For example, as the oxide semiconductor film 113a, an In—Ga—Zn oxide film having an atomic ratio of In:Ga:Zn=1:3:2 may be used, and as the oxide semiconductor film 113c, an In—Ga—Zn oxide film having an atomic ratio of In:Ga:Zn=1:3:4 or 1:4:5 may be used.

The thickness of each of the oxide semiconductor films 113a and 113c is greater than or equal to 3 nm and less than or equal to 100 nm, or preferably greater than or equal to 3 nm and less than or equal to 50 nm. The thickness of the oxide semiconductor film 113b is greater than or equal to 3 nm and less than or equal to 200 nm, greater than or equal to 3 nm and less than or equal to 100 nm, or greater than or equal to 3 nm and less than or equal to 50 nm. When the thicknesses of the oxide semiconductor films 113a and 113c are made smaller than that of the oxide semiconductor film 113b, the amount of change in the threshold voltage value of the transistor can be reduced.

The interface between the oxide semiconductor film 113b and each of the oxide semiconductor films 113a and 113c can be observed by scanning transmission electron microscopy (STEM) in some cases.

Oxygen vacancies in the oxide semiconductor film 113b can be reduced by providing the oxide semiconductor films 113a and 113c in which oxygen vacancies are less likely to be generated than the oxide semiconductor film 113b in contact with the upper surface and the lower surface of the oxide semiconductor film 113b. Furthermore, since the oxide semiconductor film 113b is in contact with the oxide semiconductor films 113a and 113c containing one or more metal elements forming the oxide semiconductor film 113b, the interface state densities between the oxide semiconductor film 113a and the oxide semiconductor film 113b and between the oxide semiconductor film 113b and the oxide semiconductor film 113c are extremely low. Accordingly, oxygen vacancies contained in the oxide semiconductor film 113b can be reduced.

In addition, with the oxide semiconductor film 113a, variation in the electrical characteristics of the transistor, such as a threshold voltage value, can be reduced.

Since the oxide semiconductor film 113c containing one or more metal elements forming the oxide semiconductor film 113b is provided in contact with the oxide semiconductor film 113b, scattering of carriers does not easily occur at an interface between the oxide semiconductor film 113b and the oxide semiconductor film 113c, and thus the field-effect mobility of the transistor can be increased.

Furthermore, the oxide semiconductor films 113a and 113c each also serve as a barrier film which suppresses formation of an impurity state due to the entry of the constituent elements of the insulating films 111 and 117 into the oxide semiconductor film 113b.

As described above, in the transistors described in this embodiment, variation in the electrical characteristics of the transistors, such as a threshold voltage value, is reduced.

Figure 13A:
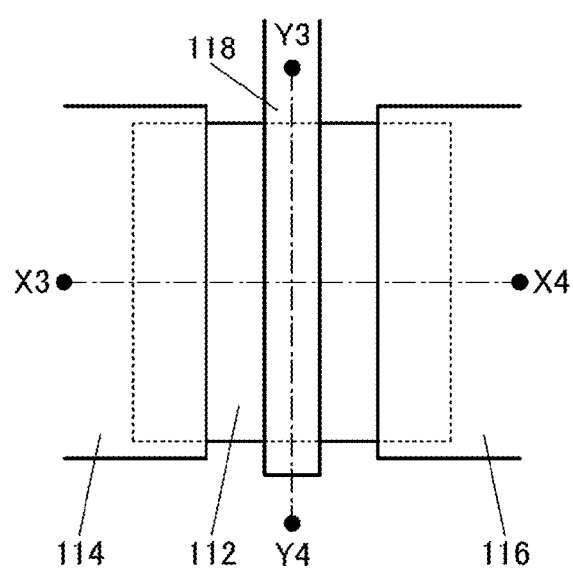
FIGS. 13A to 13C are a top view and cross-sectional views of a transistor.
Figure 13B:
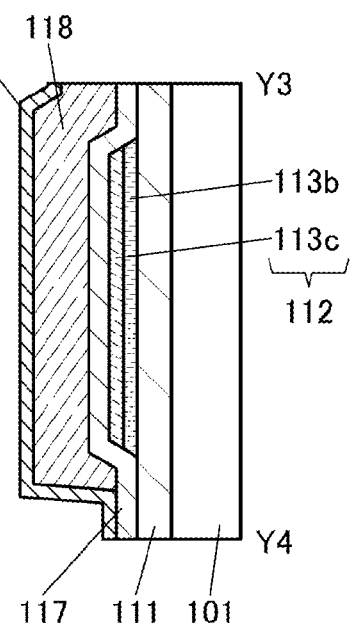
Figure 13C:
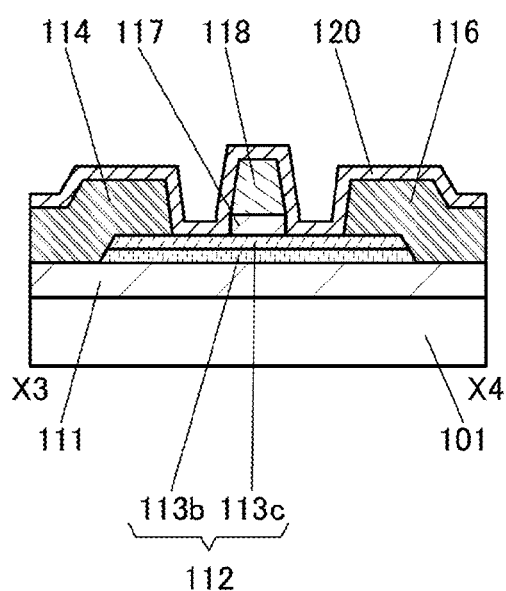

A transistor having a structure different from that in FIGS. 12A to 12C is illustrated in FIGS. 13A to 13C.

FIGS. 13A to 13C are a top view and cross-sectional views of the transistor 100E included in the display device. FIG. 13A is a top view of the transistor 100E, FIG. 13B is a cross-sectional view taken along dashed-dotted line Y1-Y2 in FIG. 13A, and FIG. 13C is a cross-sectional view taken along dashed-dotted line X1-X2 in FIG. 13A. Note that in FIG. 13A, the substrate 101, the insulating films 111, 117, and 120, and the like are omitted for simplicity. FIG. 13B is the cross-sectional view of the transistor 100E in the channel width direction. Moreover, FIG. 13C is the cross-sectional view of the transistor 100E in the channel length direction.

Like the oxide semiconductor film 112 of the transistor 100E illustrated in FIGS. 13A to 13C, the oxide semiconductor film 112 may have a stacked-layer structure of the oxide semiconductor film 113b in contact with the insulating film 111 and the oxide semiconductor film 113c in contact with the oxide semiconductor film 113b and the insulating film 117.

<Band Structure>

Figure 18A:
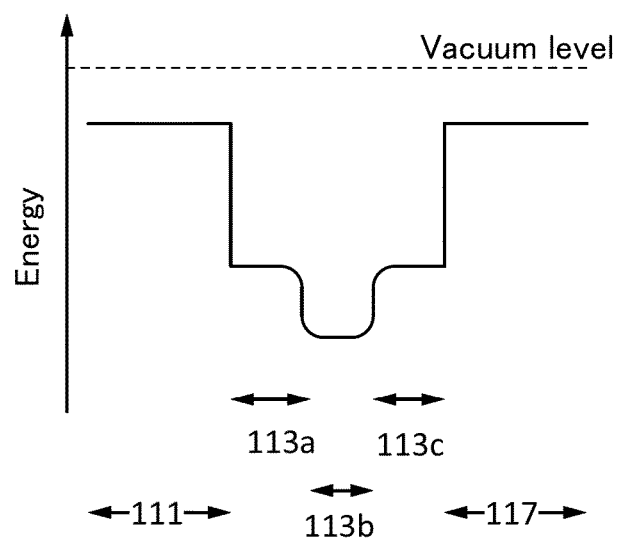
FIGS. 18A and 18B each show a band diagram of the transistor.
Figure 18B:
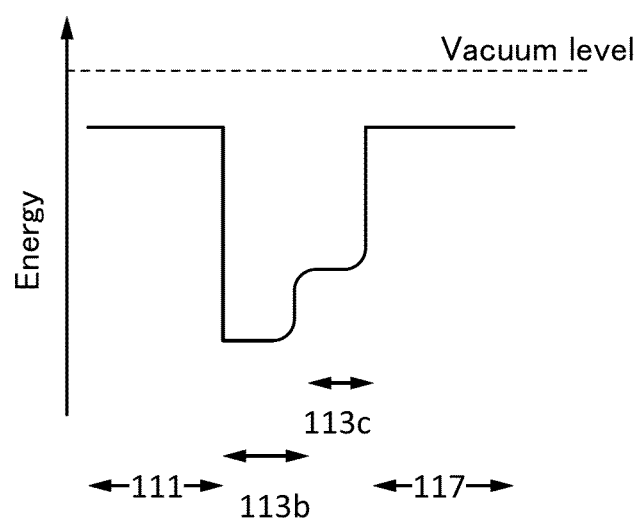

Here, the band structures of the transistor illustrated in FIGS. 12A to 12C and the transistor illustrated in FIGS. 13A to 13C are described. Note that FIG. 18A shows the band structure of the transistor 100D illustrated in FIGS. 12A to 12C, and for easy understanding, the energy (Ec) of the bottom of the conduction band of each of the insulating film 111, the oxide semiconductor films 113a, 113b, and 113c, and the insulating film 117 is shown. FIG. 18B shows the band structure of the transistor 100E illustrated in FIGS. 13A to 13C, and for easy understanding, the energy (Ec) of the bottom of the conduction band of each of the insulating film 111, the oxide semiconductor films 113b and 113c, and the insulating film 117 is shown.

As illustrated in FIG. 18A, the energies at the bottoms of the conduction bands are changed continuously in the oxide semiconductor films 113a, 113b, and 113c. This can be understood also from the fact that the constituent elements are common among the oxide semiconductor films 113a, 113b, and 113c and oxygen is easily diffused among the oxide semiconductor films 113a to 113c. Thus, the oxide semiconductor films 113a, 113b, and 113c have a continuous physical property although they are a stack of films having different compositions.

The oxide semiconductor films that are stacked and contain the same main components have not only a simple stacked-layer structure of the layers but also a continuous energy band (here, in particular, a well structure having a U shape in which energies at the bottoms of the conduction bands are changed continuously between layers (U-shaped well)). That is, the stacked-layer structure is formed so that a defect state which serves as a trap center or a recombination center in an oxide semiconductor, or an impurity which inhibits the flow of carriers does not exist at interfaces between the layers. If impurities are mixed between the oxide semiconductor films stacked, the continuity of the energy band is lost and carriers disappear by a trap or recombination.

Note that FIG. 18A illustrates the case where the Ec of the oxide semiconductor film 113a and the Ec of the oxide semiconductor film 113c are equal to each other; however, they may be different from each other.

As illustrated in FIG. 18A, the oxide semiconductor film 113b serves as a well and a channel of the transistor 100D is formed in the oxide semiconductor film 113b. Note that since the energies at the bottoms of the conduction bands are changed continuously in the oxide semiconductor films 113a, 113b, and 113c, a channel in the well structure having a U shape can also be referred to as a buried channel.

As illustrated in FIG. 18B, the energies at the bottoms of the conduction bands are changed continuously in the oxide semiconductor films 113b and 113c.

As illustrated in FIG. 18B, the oxide semiconductor film 113b serves as a well and a channel of the transistor 100E is formed in the oxide semiconductor film 113b.

The transistor 100D illustrated in FIGS. 12A to 12C includes the oxide semiconductor films 113a and 113c containing one or more metal elements forming the semiconductor film 113b; therefore, interface states are not easily formed at the interface between the oxide semiconductor film 113a and the oxide semiconductor film 113b and the interface between the oxide semiconductor film 113c and the oxide semiconductor film 113b. Thus, with the oxide semiconductor films 113a and 113c, variation or change in the electrical characteristics of the transistor, such as a threshold voltage value, can be reduced.

The transistor 100E illustrated in FIGS. 13A to 13C includes the oxide semiconductor film 113c containing one or more metal elements forming the semiconductor film 113b; therefore, an interface state is not easily formed at the interface between the oxide semiconductor film 113c and the oxide semiconductor film 113b. Thus, with the oxide semiconductor film 113c, variation or change in the electrical characteristics of the transistor, such as a threshold voltage value, can be reduced.

<Structure Example 4 of Transistor>

Next, another structure of the transistor included in the display device is described with reference to FIGS. 15A to 15D.

Figure 15A:
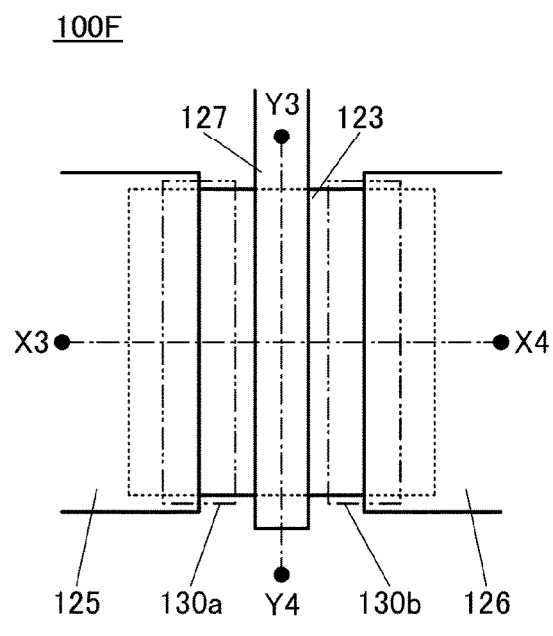
FIGS. 15A to 15D are a top view and cross-sectional views of a transistor.
Figure 15B:
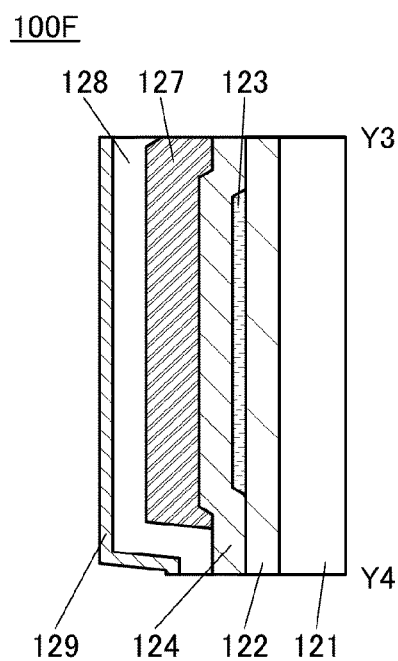
Figure 15C:
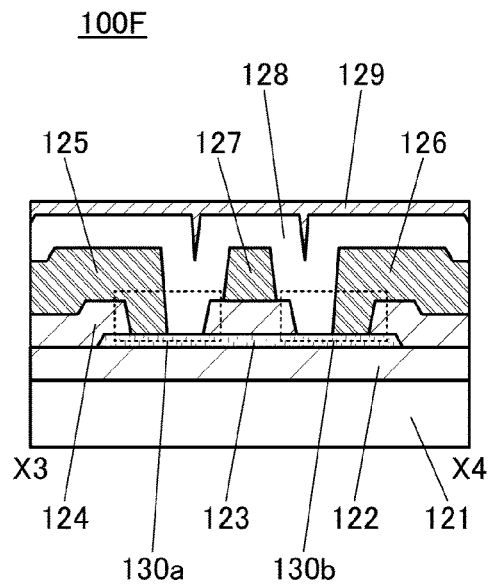

FIGS. 15A to 15C are a top view and cross-sectional views of a driving transistor 100F included in the display device. FIG. 15A is a top view of the driving transistor 100F, FIG. 15B is a cross-sectional view taken along dashed-dotted line Y3-Y4 in FIG. 15A, and FIG. 15C is a cross-sectional view taken along dashed-dotted line X3-X4 in FIG. 15A.

The driving transistor 100F illustrated in FIGS. 15A to 15D includes an oxide semiconductor film 123 over an insulating film 122 formed over a substrate 121, an insulating film 124 in contact with the oxide semiconductor film 123, a conductive film 125 in contact with the oxide semiconductor film 123 in part of an opening 130a formed in the insulating film 124, a conductive film 126 in contact with the oxide semiconductor film 123 in part of an opening 130b formed in the insulating film 124, and a conductive film 127 overlapping with the oxide semiconductor film 123 with the insulating film 124 provided therebetween. Note that insulating films 128 and 129 may be provided over the driving transistor 100F.

Regions of the oxide semiconductor film 123 not overlapping with the conductive films 125 and 126 and the conductive film 127 each include an element which forms an oxygen vacancy. An element which forms oxygen vacancy is described below as an impurity element. Typical examples of an impurity element are hydrogen, boron, carbon, nitrogen, fluorine, aluminum, silicon, phosphorus, chlorine, a rare gas element, and the like. Typical examples of a rare gas element are helium, neon, argon, krypton, and xenon.

When the impurity element is added to the oxide semiconductor film, a bond between a metal element and oxygen in the oxide semiconductor film is cut, whereby an oxygen vacancy is formed. When the impurity element is added to the oxide semiconductor film, oxygen bonded to a metal element in the oxide semiconductor film is bonded to the impurity element, whereby oxygen is detached from the metal element and accordingly an oxygen vacancy is formed. As a result, the oxide semiconductor film has a higher carrier density and thus the conductivity thereof becomes higher.

Figure 15D:
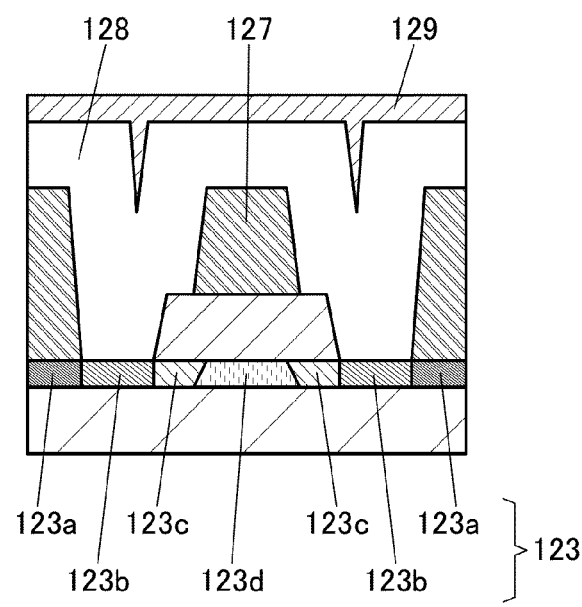

Here, FIG. 15D is a partial enlarged view of the oxide semiconductor film 123. As illustrated in FIG. 15D, the oxide semiconductor film 123 includes regions 123a in contact with the conductive films 125 and 126, regions 123b in contact with the insulating film 128, and regions 123c and a region 123d overlapping with the insulating film 124.

The region 123a has high conductivity and functions as a source region or a drain region in a manner similar to that of the region 112a illustrated in FIGS. 10A and 10B.

The regions 123b and 123c function as low-resistance regions. The regions 123b and 123c contain an impurity element. Note that the concentrations of the impurity element in the regions 123b are higher than those in the regions 123c. Note that in the case where the conductive film 127 has a tapered side surface, part of the regions 123c may overlap with the conductive film 127.

In the case where a rare gas element is used as the impurity element and the oxide semiconductor film 123 is formed by a sputtering method, the regions 123a to 123d contain the rare gas element, and the concentrations of the rare gas elements in the regions 123b and 123c are higher than those in the regions 123a and 123d. The reasons are as follows: in the case where the oxide semiconductor film 123 is formed by a sputtering method, a rare gas is used as a sputtering gas, so that the oxide semiconductor film 123 contains the rare gas; and a rare gas is intentionally added to the regions 123b and 123c in order to form oxygen vacancies in the regions 123b and 123c. Note that a rare gas element different from that in the regions 123a and 123d may be added to the regions 123b and 123c.

In the case where the impurity element is boron, carbon, nitrogen, fluorine, aluminum, silicon, phosphorus, or chlorine, only the regions 123b and 123c contain the impurity element. Therefore, the concentrations of the impurity element in the regions 123b and 123c are higher than those in the regions 123a and 123d. Note that the concentrations of the impurity element in the regions 123b and 123c which are measured by SIMS can be greater than or equal to $1\times10^{18}$ atoms/cm$^3$ and less than or equal to $1\times10^{22}$ atoms/cm$^3$, greater than or equal to $1\times10^{19}$ atoms/cm$^3$ and less than or equal to $1\times10^{21}$ atoms/cm$^3$, or greater than or equal to $5\times10^{19}$ atoms/cm$^3$ and less than or equal to $5\times10^{20}$ atoms/cm$^3$.

The concentrations of the impurity element in the regions 123b and 123c are higher than those in the regions 123a and 123d in the case where the impurity elements are hydrogen. Note that the concentrations of hydrogen in the regions 123b and 123c which are measured by SIMS can be greater than or equal to $8\times10^{19}$ atoms/cm$^3$, greater than or equal to $1\times10^{20}$ atoms/cm$^3$, or greater than or equal to $5\times10^{20}$ atoms/cm$^3$.

Since the regions 123b and 123c contain the impurity elements, oxygen vacancies and carrier densities of the regions 123b and 123c are increased. As a result, the regions 123b and 123c have higher conductivity and function as low-resistance regions.

Note that impurity element may be a combination of one or more of hydrogen, boron, carbon, nitrogen, fluorine, aluminum, silicon, phosphorus, and chlorine and one or more of rare gases. In that case, due to interaction between oxygen vacancies formed by the rare gas in the regions 123b and 123c and one or more of hydrogen, boron, carbon, nitrogen, fluorine, aluminum, silicon, phosphorus, and chlorine added to the above regions, the conductivity of the regions 123b and 123c might be further increased.

The region 123d functions as a channel.

A region of the insulating film 124 overlapping with the oxide semiconductor film 123 and the conductive film 127 functions as a gate insulating film. In addition, a region of the insulating film 124 overlapping with the oxide semiconductor film 123 and the conductive films 125 and 126 functions as an interlayer insulating film.

The conductive films 125 and 126 function as a source electrode and a drain electrode. The conductive film 127 functions as a gate electrode.

In the manufacturing process of the driving transistor 100F described in this embodiment, the conductive film 127 functioning as a gate electrode and the conductive films 125 and 126 functioning as a source electrode and a drain electrode are formed at the same time. Therefore, in the driving transistor 100F, the conductive film 127 does not overlap with the conductive films 125 and 126, and parasitic capacitance formed between the conductive film 127 and each of the conductive films 125 and 126 can be reduced. As a result, in the case where a large-sized substrate is used as the substrate 121, signal delays in the conductive films 125 and 125 and the conductive film 127 can be reduced.

In addition, in the driving transistor 100F, the impurity element is added to the oxide semiconductor film 123 using the conductive films 125 and 126 and the conductive film 127 as masks. That is, the low-resistance region can be formed in a self-aligned manner.

The substrate 101 illustrated in FIGS. 9A and 9B can be used as appropriate as the substrate 121.

The insulating film 111 illustrated in FIGS. 9A and 9B can be used as appropriate as the insulating film 122.

The oxide semiconductor films 103 and 112 illustrated in FIGS. 9A and 9B can be used as appropriate as the oxide semiconductor film 123.

The insulating films 106 and 117 illustrated in FIGS. 9A and 9B can be used as appropriate as the insulating film 124.

Since the conductive films 125 and 126 and the conductive film 127 are formed at the same time, they are formed using the same materials and have the same stacked-layer structures.

The conductive films 114 and 116, the conductive film 118, the conductive films 104 and 105, the conductive film 102, and the conductive film 107 illustrated in FIGS. 9A and 9B can be used as appropriate as the conductive films 125 and 126 and the conductive film 127.

The insulating film 128 can be formed with a single layer or a stack using one or more of an oxide insulating film and a nitride insulating film. Note that an oxide insulating film is preferably used as at least a region of the insulating film 128 that is in contact with the oxide semiconductor film 123, in order to improve characteristics of the interface with the oxide semiconductor film 123. An oxide insulating film that releases oxygen by being heated is preferably used as the insulating film 128, in which case oxygen contained in the insulating film 128 can be moved to the oxide semiconductor film 123 by heat treatment.

The insulating film 128 can be formed with a single layer or a stack using, for example, one or more of silicon oxide, silicon oxynitride, silicon nitride oxide, silicon nitride, aluminum oxide, hafnium oxide, gallium oxide, a Ga—Zn oxide, and the like.

It is preferable that the insulating film 129 be a film functioning as a barrier film against hydrogen, water, or the like from the outside. The insulating film 129 can be formed with a single layer or a stack using, for example, one or more of silicon nitride, silicon nitride oxide, aluminum oxide, and the like.

The thicknesses of the insulating films 128 and 129 each can be greater than or equal to 30 nm and less than or equal to 500 nm, or greater than or equal to 100 nm and less than or equal to 400 nm.

Note that in a manner similar to that of the transistor 100B illustrated in FIGS. 9A and 9B, the driving transistor 100F can have a dual-gate structure in which a conductive film is provided below the insulating film 122 so as to overlap with the oxide semiconductor film 123.

<Structure Example 5 of Transistor>

Next, another structure of the transistor included in the display device is described with reference to FIGS. 16A to 16C and FIGS. 17A and 17B.

Figure 16A:
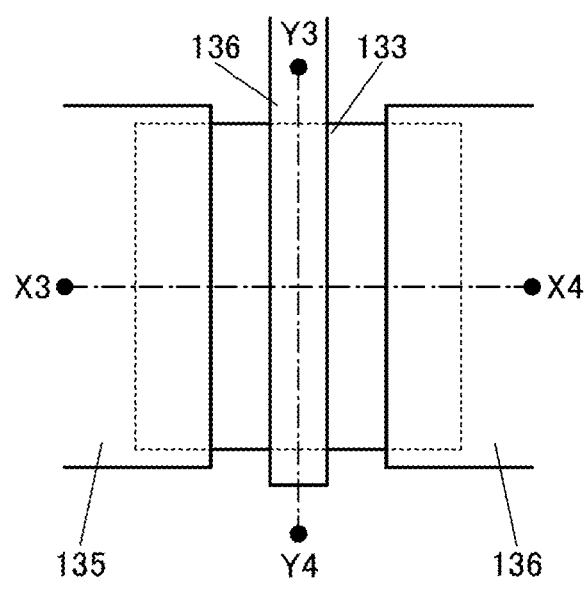
FIGS. 16A to 16C are a top view and cross-sectional views of a transistor.
Figure 16B:
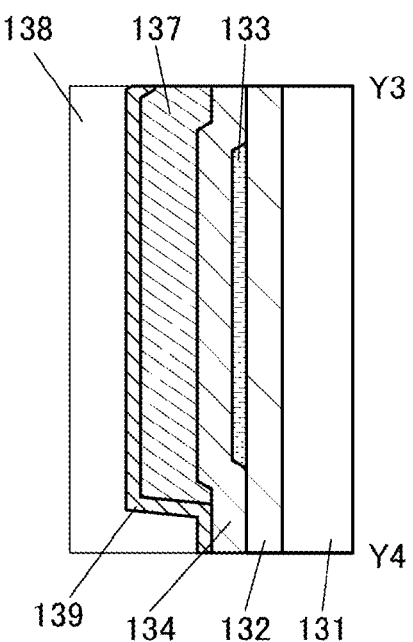
Figure 16C:
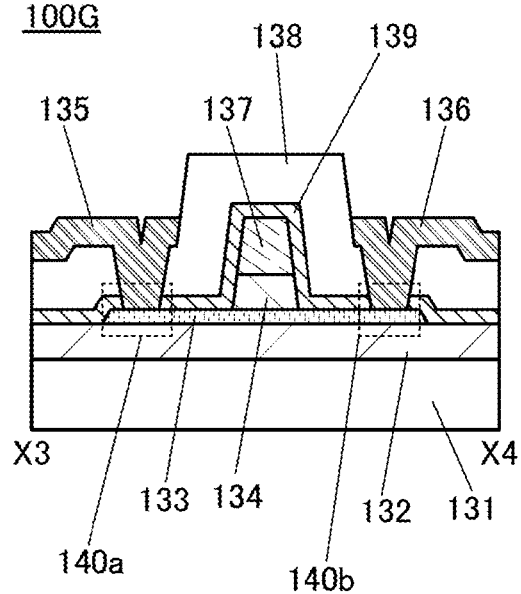

FIGS. 16A to 16C are a top view and cross-sectional views of a transistor 100G included in the display device. FIG. 16A is a top view of the transistor 100G, FIG. 16B is a cross-sectional view taken along dashed-dotted line Y3-Y4 in FIG. 16A, and FIG. 16C is a cross-sectional view taken along dashed-dotted line X3-X4 in FIG. 16A.

The transistor 100G illustrated in FIGS. 16A to 16C includes an oxide semiconductor film 133 over an insulating film 132 formed over a substrate 131, an insulating film 134 in contact with the oxide semiconductor film 133, a conductive film 137 overlapping with the oxide semiconductor film 133 with the insulating film 134 provided therebetween, an insulating film 139 in contact with the oxide semiconductor film 133, an insulating film 138 formed over the insulating film 139, a conductive film 135 in contact with the oxide semiconductor film 133 in an opening 140a formed in the insulating films 138 and 139, and a conductive film 136 in contact with the oxide semiconductor film 133 in an opening 140b formed in the insulating films 138 and 139.

The conductive film 137 of the transistor 100G functions as a gate electrode. The conductive films 135 and 136 function as a source electrode and a drain electrode.

Regions of the oxide semiconductor film 133 not overlapping with the conductive films 135 and 136 and the conductive film 137 each include an element which forms an oxygen vacancy. An element which forms oxygen vacancy is described below as an impurity element. Typical examples of an impurity element are hydrogen, boron, carbon, nitrogen, fluorine, aluminum, silicon, phosphorus, chlorine, a rare gas element, and the like. Typical examples of a rare gas element are helium, neon, argon, krypton, and xenon.

When the impurity element is added to the oxide semiconductor film, a bond between a metal element and oxygen in the oxide semiconductor film is cut, whereby an oxygen vacancy is formed. When the impurity element is added to the oxide semiconductor film, oxygen bonded to a metal element in the oxide semiconductor film is bonded to the impurity element, whereby oxygen is detached from the metal element and accordingly an oxygen vacancy is formed. As a result, the oxide semiconductor film has a higher carrier density and thus the conductivity thereof becomes higher.

Figure 17A:
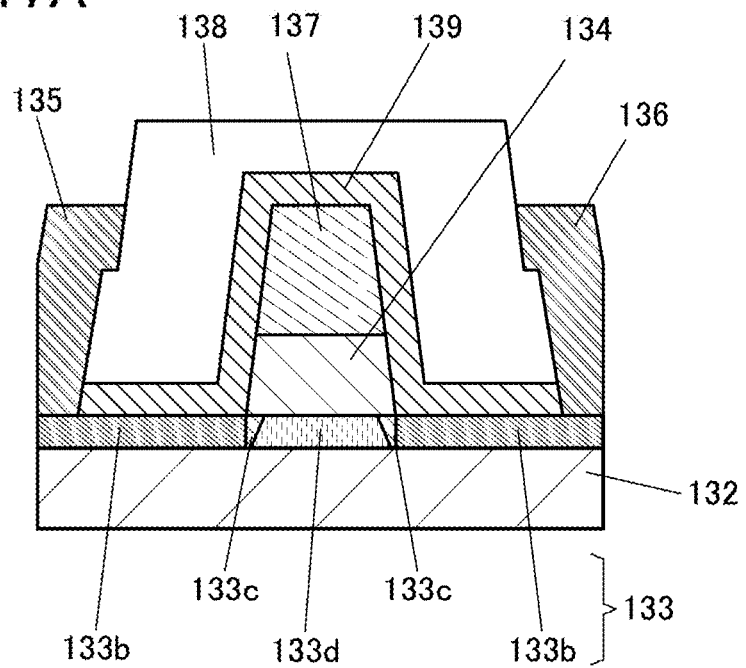
FIGS. 17A and 17B are cross-sectional views of transistors.
Figure 17B:
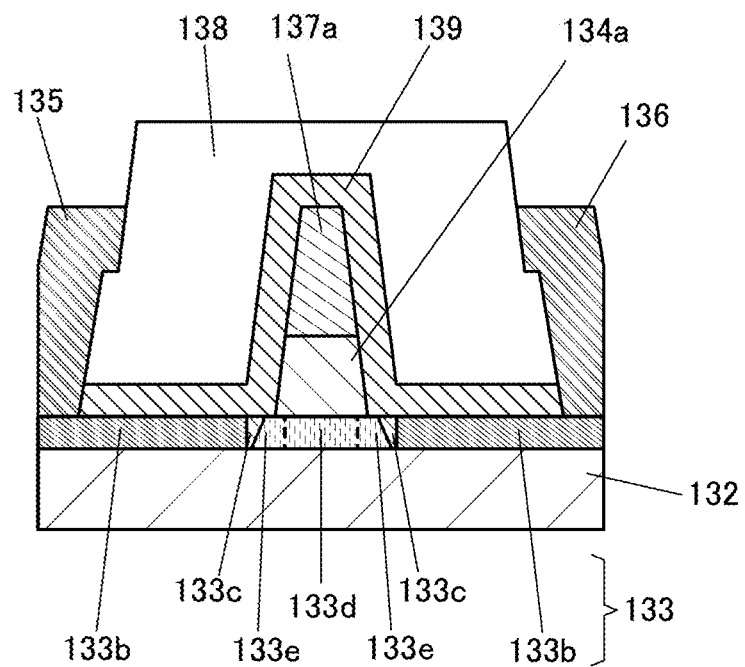

Here, FIG. 17A is a partial enlarged view of the oxide semiconductor film 133. As illustrated in FIG. 17A, the oxide semiconductor film 133 includes a region 133b in contact with the conductive films 135 and 136 or the insulating film 139 and a region 133d in contact with the insulating film 134. Note that in the case where the conductive film 137 has a tapered side surface, the oxide semiconductor film 133 may include a region 133c overlapping with a tapered portion of the conductive film 137.

The region 133b functions as a low-resistance region. The region 133b contains at least a rare gas and hydrogen as impurity elements. Note that in the case where the conductive film 137 has a tapered side surface, the impurity element is added to the region 133c through the tapered portion of the conductive film 137; therefore, the region 133c contains the impurity element, though the concentration of the rare gas element which is an example of the impurity element of the region 133c is lower than that in the region 133b. With the regions 133c, source-drain breakdown voltage of the transistor can be increased.

In the case where the oxide semiconductor film 133 is formed by a sputtering method, the regions 133b to 133d each contain the rare gas element, and the concentrations of the rare gas elements in the regions 133b and 133c are higher than those in the region 133d. The reasons are as follows: in the case where the oxide semiconductor film 133 is formed by a sputtering method, a rare gas is used as a sputtering gas, so that the oxide semiconductor film 133 contains the rare gas; and a rare gas is intentionally added to the regions 133b and 133c in order to form oxygen vacancies in the regions 133b and 133c. Note that a rare gas element different from that in the region 133d may be added to the regions 133b and 133c.

Since the region 133b is in contact with the insulating film 139, the concentration of hydrogen in the region 133b is higher than that in the region 133d. In addition, in the case where hydrogen is diffused from the region 133b to the region 133c, the concentration of hydrogen in the region 133c is higher than that in the region 133d. However, the concentration of hydrogen in the region 133b is higher than that in the region 133c.

In the regions 133b and 133c, the concentrations of hydrogen measured by secondary ion mass spectrometry (SIMS) can be greater than or equal to $8\times10^{19}$ atoms/cm$^3$, greater than or equal to $1\times10^{20}$ atoms/cm$^3$, or greater than or equal to $5\times10^{20}$ atoms/cm$^3$. Note that the concentration of hydrogen in the region 133d which is measured by secondary ion mass spectrometry can be less than or equal to $5\times10^{19}$ atoms/cm$^3$, less than or equal to $1\times10^{19}$ atoms/cm$^3$, less than or equal to $5\times10^{18}$ atoms/cm$^3$, less than or equal to $1\times10^{18}$ atoms/cm$^3$, less than or equal to $5\times10^{17}$ atoms/cm$^3$, or less than or equal to $1\times10^{16}$ atoms/cm$^3$.

In the case where boron, carbon, nitrogen, fluorine, aluminum, silicon, phosphorus, or chlorine is added to the oxide semiconductor film 133 as an impurity element, only the regions 133b and 133c contain the impurity element. Therefore, the concentrations of the impurity element in the regions 133b and 133c are higher than that in the region 133d. Note that the concentrations of the impurity element in the regions 133b and 133c which are measured by secondary ion mass spectrometry can be greater than or equal to $1\times10^{18}$ atoms/cm$^3$ and less than or equal to $1\times10^{22}$ atoms/cm$^3$, greater than or equal to $1\times10^{19}$ atoms/cm$^3$ and less than or equal to $1\times10^{21}$ atoms/cm$^3$, or greater than or equal to $5\times10^{19}$ atoms/cm$^3$ and less than or equal to $5\times10^{20}$ atoms/cm$^3$.

The regions 133b and 133c have higher concentrations of hydrogen and larger amounts of oxygen vacancies due to addition of the rare gas element than the region 133d. Therefore, the regions 133b and 133c have higher conductivity and function as low-resistance regions. The resistivity of the regions 133b and 133c can be typically greater than or equal to $1\times10^{-3}$ Ωcm and less than $1\times10^{4}$ Ωcm, or greater than or equal to $1\times10^{-3}$ Ωcm and less than $1\times10^{-1}$ Ωcm.

Note that when the amount of hydrogen in each of the regions 133b and 133c is the same as or smaller than the amount of oxygen vacancies therein, hydrogen is easily captured by oxygen vacancies and is less likely to be diffused to the region 133d serving as a channel. As a result, a transistor having normally-off characteristics can be obtained.

The region 133d functions as a channel.

In addition, after the impurity element is added to the oxide semiconductor film 133 using the conductive film 137 as a mask, the area of the conductive film 137 when seen from the above may be reduced. A slimming process is performed on a mask over the conductive film 137 in a step of forming the conductive film 137 to obtain a mask with a minuter structure. Then, the conductive film 137 and the insulating film 134 are etched using the mask, so that a conductive film 137a and an insulating film 134a illustrated in FIG. 17B can be formed. As the slimming process, an ashing process using an oxygen radical or the like can be employed, for example.

As a result, an offset region 133e is formed between the region 133c and the region 133d serving as a channel in the oxide semiconductor film 133. Note that the length of the offset region 133e in the channel length direction is set to be less than 0.1 μm, whereby a decrease in the on-state current of the transistor can be suppressed.

The substrate 101 illustrated in FIGS. 9A and 9B can be used as appropriate as the substrate 131 illustrated in FIGS. 16A to 16C.

The insulating film 111 illustrated in FIGS. 9A and 9B can be used as appropriate as the insulating film 132 illustrated in FIGS. 16A to 16C.

The oxide semiconductor films 103 and 112 illustrated in FIGS. 9A and 9B can be used as appropriate as the oxide semiconductor film 133 illustrated in FIGS. 16A to 16C.

The insulating films 106 and 117 illustrated in FIGS. 9A and 9B can be used as appropriate as the insulating film 134 illustrated in FIGS. 16A to 16C.

The conductive films 114 and 116, the conductive film 118, the conductive films 104 and 105, the conductive film 102, and the conductive film 107 illustrated in FIGS. 9A and 9B can be used as appropriate as the conductive films 135 and 136 and the conductive film 137 illustrated in FIGS. 16A to 16C.

The thicknesses of the conductive film 137 and the insulating film 138 each can be greater than or equal to 30 nm and less than or equal to 500 nm, or greater than or equal to 100 nm and less than or equal to 400 nm.

In the transistor 100G, the conductive film 137 does not overlap with the conductive films 135 and 136, and parasitic capacitance formed between the conductive film 137 and each of the conductive films 135 and 136 can be reduced. As a result, in the case where a large-sized substrate is used as the substrate 131, signal delays in the conductive films 135 and 136 and the conductive film 137 can be reduced.

In addition, in the transistor 100G, the impurity element is added to the oxide semiconductor film 133 using the conductive film 137 as a mask. That is, the low-resistance region can be formed in a self-aligned manner.

Note that in a manner similar to that of the transistor 100B illustrated in FIGS. 9 and 9B, the transistor 100G can have a dual-gate structure in which a conductive film is provided below the insulating film 132 so as to overlap with the oxide semiconductor film 133.

The structure described above in this embodiment can be combined as appropriate with any of the structures described in the other embodiments.

Embodiment 3

Figure 19:
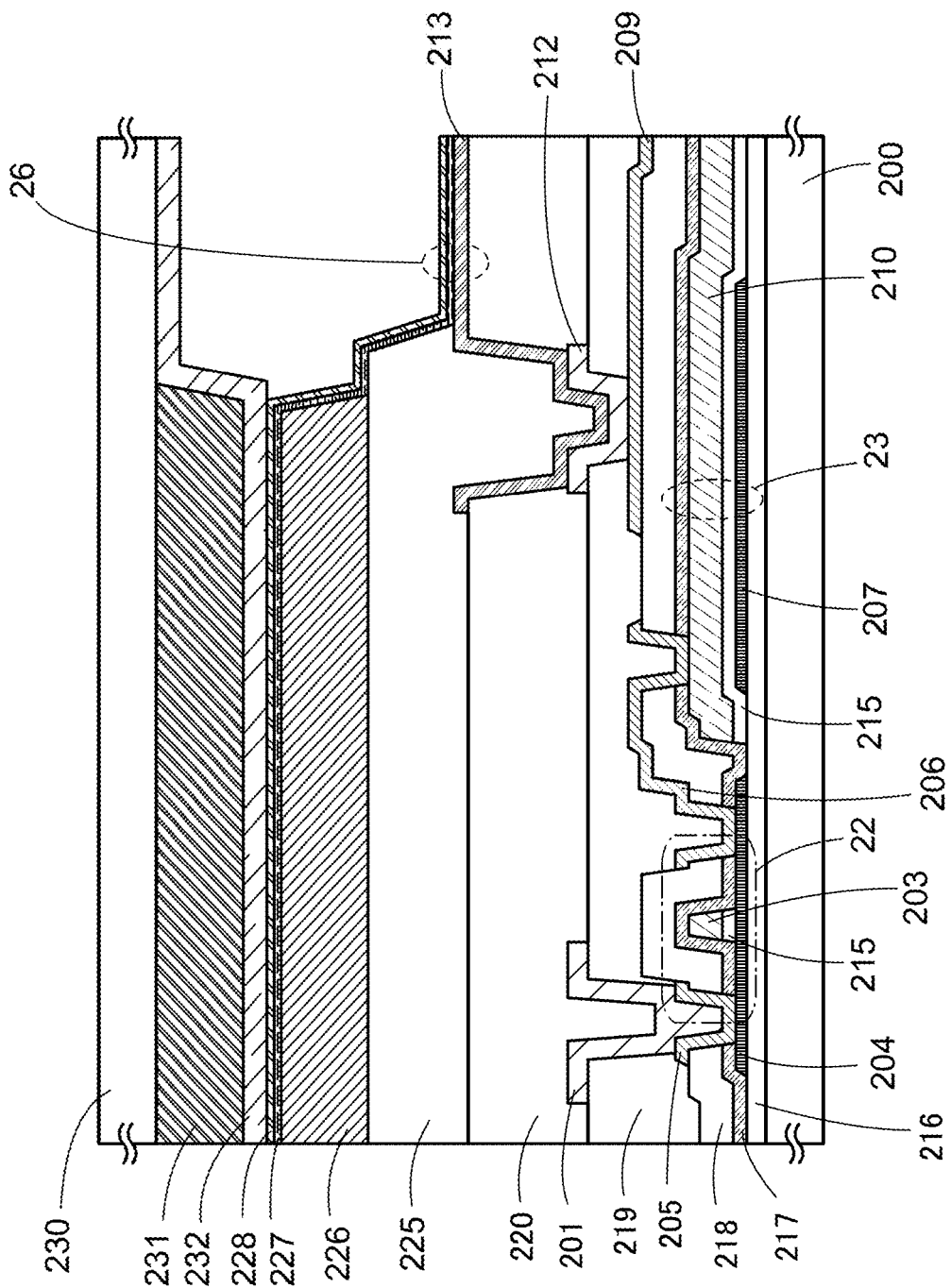
FIG. 19 is a cross-sectional view of a display device.

An example of a cross-sectional view of a display pixel of a display device will be described in this embodiment. FIG. 19 illustrates cross-sectional structures of the selection transistor 22, the capacitor 23, and the light-emitting element 26 of the display pixel 21.

Specifically, the display device illustrated in FIG. 19 includes an insulating film 216 over a substrate 200, and the selection transistor 22 and the capacitor 23 over the insulating film 216. The selection transistor 22 includes a semiconductor film 204, an insulating film 215 over the semiconductor film 204, a conductive film 203 overlapping with the semiconductor film 204 with the insulating film 215 provided therebetween and functioning as a gate, a conductive film 205 which is in contact with the semiconductor film 204 and is provided in an opening formed in an insulating film 217 and an insulating film 218, and a conductive film 206 which is similarly in contact with the semiconductor film 204 and is provided in the opening formed in the insulating films 217 and 218. Note that the conductive films 205 and 206 function as a source and a drain of the selection transistor 22.

The capacitor 23 includes a semiconductor film 207 functioning as an electrode, the insulating film 215 over the semiconductor film 207, and a conductive film 210 overlapping with the semiconductor film 207 with the insulating film 215 provided therebetween and functioning as an electrode.

The insulating film 215 may be formed with a single layer or a stack of an insulating film containing one or more of aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Note that in this specification, oxynitride contains more oxygen than nitrogen, and nitride oxide contains more nitrogen than oxygen.

In the case where an oxide semiconductor is used for the semiconductor film 204, it is preferable to use a material that can supply oxygen to the semiconductor film 204 for the insulating film 216. By using the material for the insulating film 216, oxygen contained in the insulating film 216 can be moved to the semiconductor film 204, and the amount of oxygen vacancy in the semiconductor film 204 can be reduced. Oxygen contained in the insulating film 216 can be moved to the semiconductor film 204 efficiently by heat treatment performed after the semiconductor film 204 is formed.

The insulating film 217 is provided over the semiconductor film 204 and the conductive films 203 and 210; the insulating film 218 is provided over the insulating film 217; and the conductive films 205 and 206, a conductive film 209, and an insulating film 219 are provided over the insulating film 218. Conductive films 201 and 212 are provided over the insulating film 219, the conductive film 201 is connected to the conductive film 205 in an opening formed in the insulating film 219, and the conductive film 212 is connected to the conductive film 209 in the opening formed in the insulating film 219.

In the case where an oxide semiconductor is used for the semiconductor film 204, the insulating film 217 preferably has a function of blocking oxygen, hydrogen, water, an alkali metal, an alkaline earth metal, and the like. It is possible to prevent outward diffusion of oxygen from the semiconductor film 204 and entry of hydrogen, water, or the like into the semiconductor film 204 from the outside by providing the insulating film 217. The insulating film 217 can be formed using a nitride insulating film, for example. As the nitride insulating film, a silicon nitride film, a silicon nitride oxide film, an aluminum nitride film, an aluminum nitride oxide film, and the like can be given. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

An insulating film 220 and a conductive film 213 are provided over the insulating film 219 and the conductive films 201 and 212, and the conductive film 213 is connected to the conductive film 212 in an opening formed in the insulating film 220.

An insulating film 225 is provided over the insulating film 220 and the conductive film 213. The insulating film 225 has an opening in a region overlapping with the conductive film 213. Over the insulating film 225, an insulating film 226 is provided in a region different from the opening of the insulating film 225. An EL layer 227 and a conductive film 228 are sequentially stacked over the insulating films 225 and 226. A portion in which the conductive films 213 and 228 overlap with each other with the EL layer 227 provided therebetween functions as the light-emitting element 26. One of the conductive films 213 and 228 functions as the anode, and the other functions as the cathode.

The display device includes a substrate 230 that faces the substrate 200 with the light-emitting element 26 provided therebetween. A blocking film 231 having a function of blocking light is provided under the substrate 230, i.e., a surface of the substrate 230 that is closer to the light-emitting element 26 is provided with the blocking film 231. The blocking film 231 has an opening in a region overlapping with the light-emitting element 26. In the opening overlapping with the light-emitting element 26, a coloring layer 232 that transmits visible light in a specific wavelength range is provided under the substrate 230.

Note that the insulating film 226 is provided to adjust the distance between the light-emitting element 26 and the substrate 230 and may be omitted in some cases.

Although the top-emission structure is employed in this embodiment in which light of the light-emitting element 26 is extracted from the side opposite to the light-emitting element substrate, a bottom-emission structure in which light of the light-emitting element 26 is extracted from the light-emitting element substrate side or a dual-emission structure in which light of the light-emitting element 26 is extracted from both the light-emitting element substrate side and the side opposite to the light-emitting element substrate can also be applied to embodiments.

The structure described above in this embodiment can be combined as appropriate with any of the structures described in the other embodiments.

Embodiment 4

In this embodiment, a display module and electronic devices that can be formed using a display device described in any of the above embodiments will be described.

<External View of Display Device>

Figure 20:
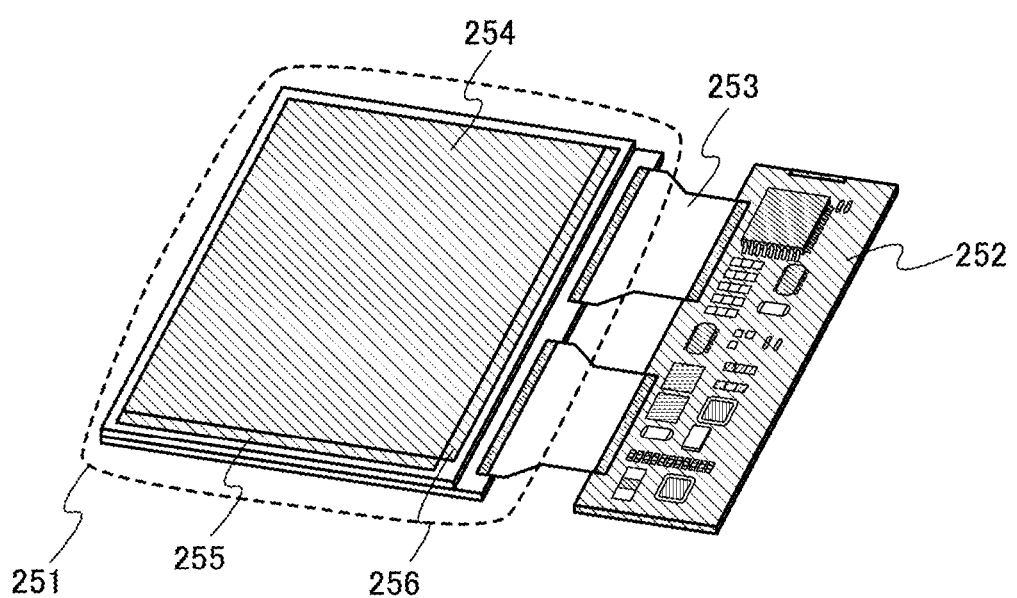
FIG. 20 is a perspective view showing a display device.

FIG. 20 is a perspective view illustrating an example of an external view of a display device. The display device illustrated in FIG. 20 includes a panel 251; a circuit board 252 including a controller, a power supply circuit, an image processing circuit, an image memory, a CPU, and the like; and a connection portion 253. The panel 251 includes a pixel portion 254 including a plurality of pixels, a driver circuit 255 that selects pixels row by row, and a driver circuit 256 that controls input of an image signal IMG to the pixels in a selected row.

A variety of signals and power supply potentials are input from the circuit board 252 to the panel 251 through the connection portion 253. As the connection portion 253, a flexible printed circuit (FPC) or the like can be used. In the case where a COF tape is used as the connection portion 253, part of circuits in the circuit board 252 or part of the driver circuit 255 or the driver circuit 256 included in the panel 251 may be formed on a chip separately prepared, and the chip may be electrically connected to the COF tape by a chip-on-film (COF) method.

<Structure Example of Electronic Device>

The display device described in any of the above embodiments can be used for display devices, notebook personal computers, or image reproducing devices provided with recording media (typically, devices which reproduce the content of recording media such as digital versatile discs (DVDs) and have displays for displaying the reproduced images). Other than the above, as an electronic device which can use the display device described in any of the above embodiments, cellular phones, portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 21A to 21F illustrate specific examples of these electronic devices.

Figure 21A:
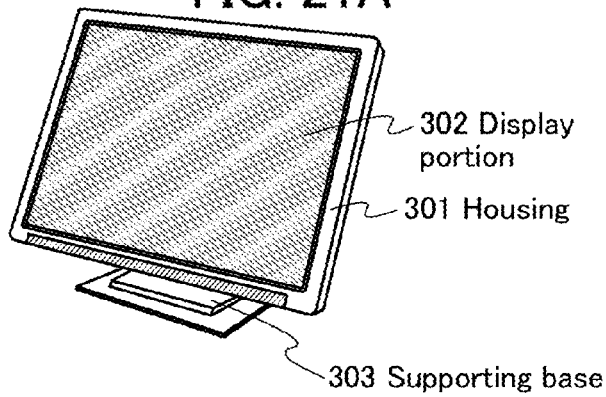
FIGS. 21A to 21F are diagrams showing electronic devices.

FIG. 21A illustrates a display device, which includes a housing 301, a display portion 302, a supporting base 303, and the like. The display device described in any of the above embodiments can be used for the display portion 302. Note that the display device includes all devices for displaying information such as for a personal computer, for receiving TV broadcasting, and for displaying an advertisement.

Figure 21B:
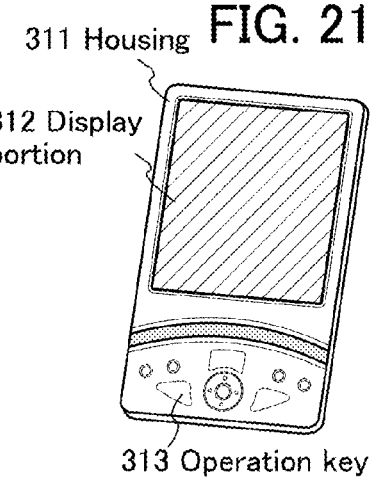

FIG. 21B illustrates a portable information terminal, which includes a housing 311, a display portion 312, operation keys 313, and the like. The display device described in any of the above embodiments can be used for the display portion 312.

Figure 21C:
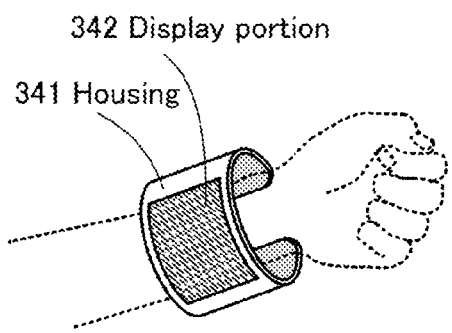

FIG. 21C illustrates a display device, which includes a housing 341, a display portion 342, and the like having a curved surface. When a flexible substrate is used for the display device described in any of the above embodiments, the display device can be used for the display portion 342 supported by the housing 341 having a curved surface. It is thus possible to provide a user-friendly display device that is flexible and lightweight.

Figure 21D:
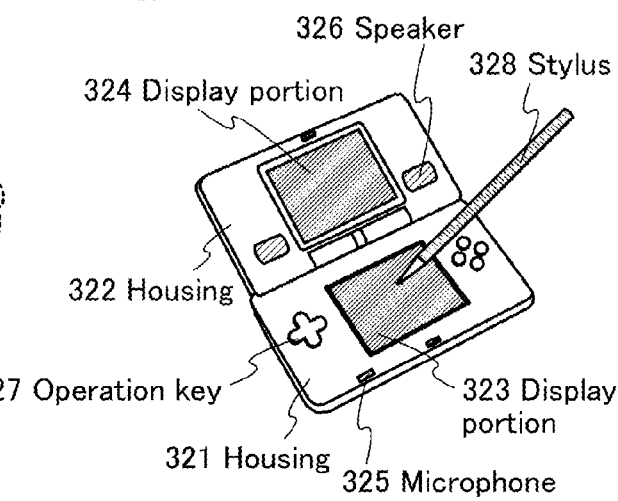

FIG. 21D illustrates a portable game machine, which includes a housing 321, a housing 322, a display portion 323, a display portion 324, a microphone 325, a speaker 326, an operation key 327, a stylus 328, and the like. The display device described in any of the above embodiments can be used for the display portion 323 or the display portion 324. When the display device described in any of the above embodiments is used as the display portion 323 or 324, it is possible to provide a user-friendly portable game machine with quality that hardly deteriorates. Although the portable game machine in FIG. 21D has the two display portions 323 and 324, the number of display portions included in the portable game machine is not limited to two.

Figure 21E:
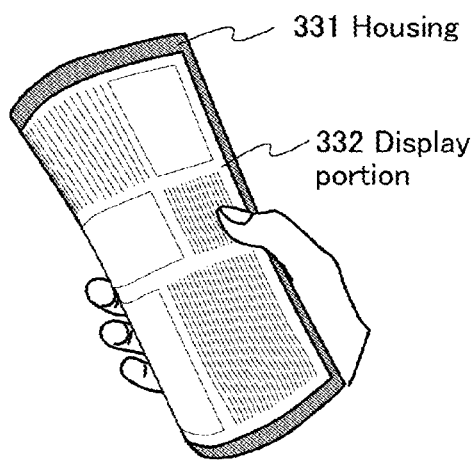

FIG. 21E illustrates an e-book reader, which includes a housing 331, a display portion 332, and the like. The display device described in any of the above embodiments can be used for the display portion 332. When a flexible substrate is used, the display device can have flexibility, so that it is possible to provide a flexible and lightweight e-book reader.

Figure 21F:
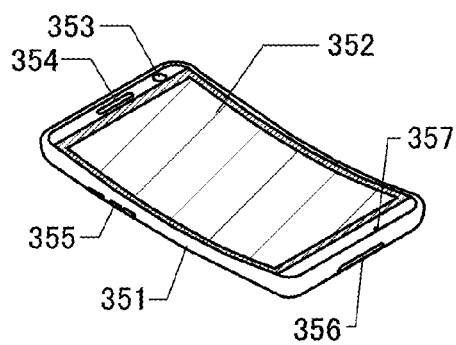

FIG. 21F illustrates a cellular phone, which includes a display portion 352, a microphone 357, a speaker 354, a camera 353, an external connection portion 356, and an operation button 355 in a housing 351. The display device described in any of the above embodiments can be used for the display portion 352. When the display device described in any of the above embodiments is provided over a flexible substrate, the display device can be used for the display portion 352 having a curved surface, as illustrated in FIG. 21F.

The structure described above in this embodiment can be combined as appropriate with any of the structures described in the other embodiments.

This application is based on Japanese Patent Application serial no. 2014-180767 filed with Japan Patent Office on Sep. 5, 2014, the entire contents of which are hereby incorporated by reference.

What is claimed is:

1. A measurement method comprising the steps of:
   in measuring currents flowing through wirings in a device which includes components arranged in a matrix with N rows and M columns (N and M are each an integer greater than or equal to 2) and M wirings, one for each column, and where each component is capable of supplying current to a corresponding one of the wirings using a corresponding one of electrical elements included in the components,
   setting supply and non-supply of current in the component in a kth row and an mth column (k is an integer greater than or equal to 1 and less than or equal to N and m is an integer greater than or equal to 1 and less than or equal to M) in an nth (n is an integer greater than or equal to 1 and less than or equal to N) measurement to $\alpha[k]_n$ ($\alpha[k]_n$ is 1 or 0, where $\alpha[k]_n$ is 1 in a case where current flows from the component to the wiring or in a case where current flows from the wiring to the component, and where $\alpha[k]_n$ is 0 in a case where current is not supplied),
   identifying current flowing through a wiring corresponding to an mth column obtained by measurement as I[n,m], and
   determining a value of a current that the component in the kth row and the mth column is capable of supplying to the corresponding wiring based on an element in the kth row and the mth column in an N×M matrix obtained by a product of an inverse matrix of a square matrix A with N rows (in the square matrix A with N rows, an element in an nth row and a kth column is $\alpha[k]_n$) and an N×M matrix I in which an element in an nth row and an mth column is I[n,m].

2. A matrix device capable of performing the measurement method according to claim 1.

3. The matrix device according to claim 2,
   wherein the matrix device is a display device or a photodetector device.

4. A driving method of a matrix device wherein input data or output data is corrected based on a current value of a component which is measured by the measurement method according to claim 1.

5. The measurement method according to claim 1,
   wherein elements of the inverse matrix of the square matrix A with N rows are not zero.

6. The measurement method according to claim 1,
   wherein amplitudes of elements of the inverse matrix of the square matrix A with N rows are the same.

7. The measurement method according to claim 6,
   wherein N is an odd number and the sum of elements in an arbitrary row in the square matrix A with N rows is 2.

8. The measurement method according to claim 1,
   wherein the square matrix A with N rows is a circulant matrix.

* * * * *